United States Patent [19]
Koskenmaki et al.

[11] Patent Number: 6,000,603
[45] Date of Patent: Dec. 14, 1999

[54] PATTERNED ARRAY OF METAL BALLS AND METHODS OF MAKING

[75] Inventors: David C. Koskenmaki, St. Paul, Minn.; Randolph D. Schueller, Austin, Tex.; Robert P. McCollam, Roseville, Minn.

[73] Assignee: 3M Innovative Properties Company, Saint Paul, Minn.

[21] Appl. No.: 08/862,804

[22] Filed: May 23, 1997

[51] Int. Cl.⁶ .......................... B23K 35/12; B23K 31/02; B21D 39/00

[52] U.S. Cl. ................... 228/246; 228/170; 228/180.22; 228/254

[58] Field of Search .................... 228/254, 160, 228/164, 170, 174, 180.22, 246, 252; 438/613

[56] References Cited

U.S. PATENT DOCUMENTS

| | | | |
|---|---|---|---|
| 3,380,155 | 4/1968 | Burks | 29/591 |
| 3,396,894 | 8/1968 | Ellis | 228/56 |
| 3,458,925 | 8/1969 | Napier et al. | 229/578 |
| 3,719,981 | 3/1973 | Steitz | 49/423 |
| 3,772,486 | 11/1973 | Wilentchik | 200/16 |
| 4,234,666 | 11/1980 | Gursky | 428/573 |
| 4,354,629 | 10/1982 | Grassauer et al. | 228/56 |
| 4,380,042 | 4/1983 | Angelucci, Sr. et al. | 361/421 |
| 4,661,192 | 4/1987 | McShane | 156/292 |
| 4,811,081 | 3/1989 | Lyden | 357/80 |
| 4,898,320 | 2/1990 | Dunaway et al. | 228/245 |
| 4,950,623 | 8/1990 | Dishon | 437/183 |
| 5,024,372 | 6/1991 | Altman et al. | 228/248 |
| 5,133,495 | 7/1992 | Angulas et al. | 228/180.1 |
| 5,275,970 | 1/1994 | Itoh et al. | 437/183 |
| 5,284,287 | 2/1994 | Wilson et al. | 228/180.2 |
| 5,323,947 | 6/1994 | Juskey et al. | 228/56.3 |
| 5,349,500 | 9/1994 | Casson et al. | 361/749 |
| 5,366,140 | 11/1994 | Koskenmaki et al. | 228/246 |
| 5,381,848 | 1/1995 | Trabucco | 164/102 |
| 5,388,327 | 2/1995 | Trabucco | 29/830 |
| 5,486,427 | 1/1996 | Koskenmaki et al. | 428/546 |
| 5,504,277 | 4/1996 | Danner | 174/261 |
| 5,643,831 | 7/1997 | Ochiai et al. | 437/183 |
| 5,735,452 | 4/1998 | Yu et al. | 228/254 |
| 5,829,668 | 11/1998 | George et al. | 228/254 |
| 5,834,365 | 11/1998 | Ming-Tsung et al. | 438/612 |

FOREIGN PATENT DOCUMENTS

4-262895   9/1992   Japan ..................... B23K 35/40

*Primary Examiner*—Patrick Ryan
*Assistant Examiner*—Kiley Stoner
*Attorney, Agent, or Firm*—Matthew B. McNutt

[57] ABSTRACT

The present invention relates to a method for making an array of metal balls. The method includes the step of generating a first pattern on a metal foil which includes a plurality of foil projections. The method also includes the step of generating a second pattern on a carrier substrate. The second pattern includes a plurality of carrier recesses that are arranged and configured to correspond with the foil projections of the first pattern. The method further includes the steps of placing the metal foil and the carrier substrate together such that the foil projections of the metal foil fit within the carrier recesses of the carrier substrate, and melting the metal foil such that the foil projections form metal balls positioned within the carrier recesses of the carrier substrate. The invention also relates to metal ball arrays constructed via the above method.

13 Claims, 19 Drawing Sheets

1 mm

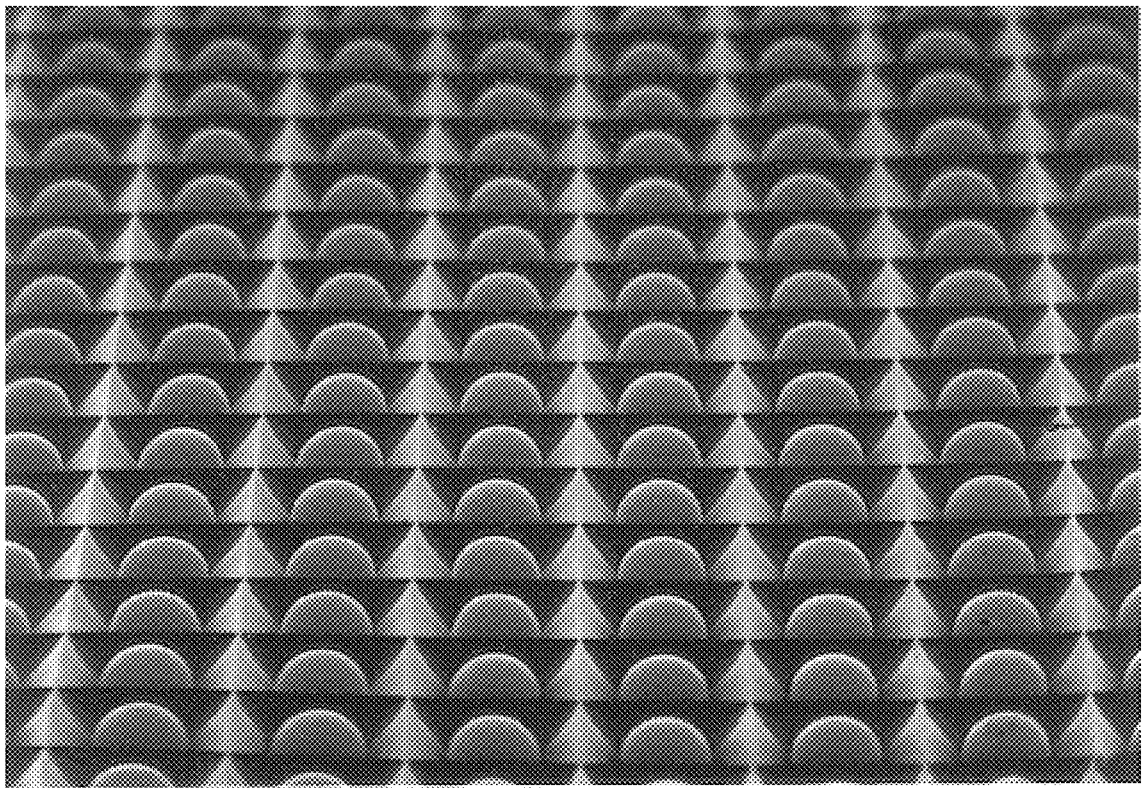
FIG.17  1 mm

PATTERNED ARRAY OF METAL BALLS AND METHODS OF MAKING

FIELD OF THE INVENTION

The present invention relates generally to the field of electronics packaging. More particularly, the present invention relates to solder ball arrays for use with electronic packages, and methods of making the solder ball arrays.

BACKGROUND OF THE INVENTION

In recent years, the electronic equipment and telecommunications industries have experienced significant growth. One reason for the success of such industries relates to their ability to develop appliances such as computers, tape players, televisions, telephones and other devices that are increasingly smaller, thinner and more portable. The ability to miniaturize electronic and telecommunication components has been made possible at least partially through developments in the field of electronics packaging.

Electronic packages are used to mount integrated circuit (IC) chips to substrates such as printed circuit boards. Electronic packages physically and electrically connect the integrated circuit chips to the substrates and protect the chips from hostile environments. The package provides a means by which electrical connection can be made from the finely spaced electrodes or electrical contact pads of the IC chip to the more coarsely spaced circuitry of the printed circuit board. Common types of techniques for connecting IC chips to electronic packages include tape automated bonding, wire bonding, and flip chip solder bumping. Of the three techniques, solder bumping is experiencing increased popularity because it provides precise, reliable connections at high packaging densities.

Electronic packages have been traditionally connected to printed circuit boards by means of sets of connecting conductors arranged around the periphery of the package which, depending on their shapes, are called "J" leads or "gull-wing" leads. These leads are soldered to corresponding pads on the printed circuit board using surface mount technology. As the spacing or pitch of these peripheral leads has decreased, connection of these leads has become more difficult. To address this problem, arrays of solder balls are increasingly replacing peripheral leads as a means to make electronic connection between packages and printed circuit boards. These arrays, commonly called ball grid arrays or BGA's, can be spread over the full area of the bottom of the electronic package rather than just the peripheries, thus lessening the need for fine pitch.

Ball grid arrays commonly use a plurality of solder balls arranged in an array to provide a connection between an electronic package and a substrate such as a printed circuit board. Typically, the solder balls of the array are positioned between conductive pads or terminals on the electronic package and conductive pads or terminals on the substrate. Once the package has been properly aligned with the substrate, the solder balls are melted and then cooled such that connections are made between the pads of the package and the pads of the substrate.

Solder balls can be manufactured by a variety of techniques. Exemplary techniques include direct casting (U.S. Pat. Nos. 5,388,327 and 5,381,848), dipping solder wettable pads in molten solder (U.S. Pat. No. 4,950,623), melting portions of cut off wires (U.S. Pat. Nos. 4,661,192 and 3,380,155) reflowing solder paste within recesses or wells (U.S. Pat. Nos. 5,024,372 and 5,133,495), evaporation of solder through masks (U.S. Pat. No. 3,458,925), and cutting a thin film of metal into chips and melting the chips against a ceramic jig having recesses which collect microspheres of the melted metal (Japanese Patent Application 4-262895).

A variety of techniques can be used to arrange solder balls in arrays. Exemplary techniques include using adhesive to hold pre-formed solder balls in a desired array on a flat carrier tape (U.S. Pat. Nos. 5,323,947 and 3,719,981), partitioning a metal film and then melting the film to form an array of microbeads (U.S. Pat. Nos. 5,366,140 and 5,486,427), positioning loose balls using a vacuum placement tool (U.S. Pat. No. 5,284,287), and positioning balls using a template (U.S. Pat. No. 5,504,277).

The competitive nature of the electronics industry combined with the need for smaller and thinner electronic components generates special concerns for electronic package designers. For example, one concern relates to reducing the cost of electrical connecting techniques such as solder bumping and ball grid arrays. A concern specific to solder bumping and ball grid arrays includes providing solder balls having uniform sizes. Another concern specific to solder bumping and ball grid arrays includes providing solder ball arrays having solder balls precisely aligned at desired locations. The present invention addresses these concerns as well as other concerns.

SUMMARY OF THE INVENTION

One aspect of the present invention relates to an array of discrete solder preforms mounted on a backing tape. The discrete solder preforms are solder sections which are sized and shaped to project outward from the backing tape to form projections. The projection of each section has an apex which lies in a common plane with apexes of the projections of the other solder sections. The term "preform" is defined as a section of solder foil which, in use, will be melted to provide an electrical or mechanical connection.

Another aspect of the present invention relates to a method of making the above-described array. The method includes the step of providing a sheet of backing material with a solder foil adhered to one side by a deformable adhesive material. The method also includes the step of partitioning the solder foil against an embossing tool such that the solder foil is partitioned into discrete sections with each section having a rounded apex that projects outward from the sheet of backing material.

A further aspect of the present invention relates to a method for using the aforementioned array. The method includes the step of placing the array of projecting solder sections against a corresponding array of electrical circuit pads on an electronic package, printed circuit board, or integrated circuit chip. The method also includes the step of melting the solder sections such that the solder wets to the array of electrical circuit pads. The method further includes the step of removing the backing tape from the solder sections such that the solder sections are transferred to the electrical circuit pads.

An additional aspect of the present invention relates to a method for making an array of metal balls. The method includes the step of generating a first pattern on a metal foil which includes a plurality of foil projections. The method also includes the step of generating a second pattern on a carrier substrate. The second pattern includes a plurality of carrier recesses that are arranged and configured to correspond with the foil projections of the first pattern. The method further includes the steps of placing the metal foil and the carrier substrate together such that the foil projections of the metal foil fit within the carrier recesses of the carrier substrate, and melting the metal foil such that the foil projections form metal balls positioned within the carrier recesses of the carrier substrate.

Throughout the specification and claims, the term "pattern" refers to a set of vertical relief features having a repeating design that are part of a surface. These features can include grooves, ridges, recesses, and projections. The term "patterning" means forming a pattern on a surface. The term "patterned" describes an article which is formed or fabricated with the aid of a pattern.

One more aspect of the present invention relates to an alternative method for making an array of metal balls. The method includes the step of providing a metal foil having a patterned back side that includes a plurality of foil projections. The method also includes the step of placing a flowable backing material over the back side of the patterned metal foil such that the foil projections are substantially covered by the backing material. The method further includes the step of hardening the backing material on the metal foil such that the hardened backing material forms a carrier substrate having a plurality of carrier recesses containing the foil projections. The method can also further include the step of melting the metal foil such that the foil projections form metal balls positioned within the carrier recesses.

Still another aspect of the present invention relates to an additional method for making an array of metal balls. The method includes the step of providing a metal foil having a front side and a back side. The method also includes the step of providing a temporary supporting tape adhered to the front side of the metal foil. The method further includes the step of patterning and partitioning the metal foil such that the back side of the metal foil forms a plurality of foil projections which are partitioned into a plurality of discrete sections. The method additionally includes the steps of placing a flowable backing material over the back side of the metal foil such that the foil projections are substantially covered by the backing material, and hardening the backing material on the metal foil, the hardened backing material forming a carrier substrate having a plurality of carrier recesses containing the foil projections. The method further includes the step of removing the temporary supporting tape and melting the partitioned metal foil to form an array of metal balls positioned within the carrier recesses.

The various methods of the present invention are adapted to generate metal balls that have uniform dimensions and that are precisely aligned in arrays suitable for providing connections between substrates and electronic packages. The various methods are also adapted to allow metal ball arrays to be rapidly and inexpensively manufactured via continuous automated processes. Additionally, the above-described methods are advantageous because they can be used to produce arrays of uniform balls over a large range of pitches and ball sizes. The only limitation to the fineness of the arrays is the fineness to which a patterning tool can be fabricated.

One further aspect of the present invention relates to a metal ball array apparatus including a carrier tape defining a plurality of carrier recesses, and a plurality of metal balls individually contained within the carrier recesses. The recesses function to protect and to maintain precise positioning of the metal balls within the array. The recesses also serve to confine the balls and prevent them from flowing together when they are melted and transferred to the pads of a circuit. The array apparatus is preferably used by aligning the metal balls with a corresponding array of electrical circuit pads, and melting the metal balls such that the metal balls are transferred to the electrical circuit pads.

A variety of additional advantages of the invention will be set forth in part in the description which follows, and in part will be obvious from the description, or may be learned by practice of the invention. The advantages of the invention will be realized and attained by means of the elements and combinations particularly pointed out in the claims. It is to be understood that both the foregoing general description and the following detailed description are exemplary and explanatory only and are not restrictive of the invention as claimed.

BRIEF DESCRIPTION OF THE DRAWING FIGURES

The present invention will be described with reference to the accompanying drawings, wherein like reference numerals identify corresponding or like components.

In the drawings:

FIGS. 10–17 are scanning electron micrographs of structures made in accordance with the present invention.

DETAILED DESCRIPTION

FIGS. 1a–1e illustrate a method for preparing and placing a patterned array of metal balls, or a ball grid array, onto semiconductors, microelectronic chips, or other substrates such as electronic packages or printed circuit boards. FIGS. 3a–3c, 4, 5a–5c, 6, 7a–7e, and 8a–8f illustrate methods for preparing a patterned array of metal balls on heat resistant backing members or carrier tapes. In the figures, the methods disclosed are shown in only two dimensions. This is for illustration purposes only, as the present invention is practiced in three dimensions. For example, the ball grid arrays are applied to three-dimensional backing layers, carrier tape sheets, plate-like substrates, or support members.

Figure 1A:
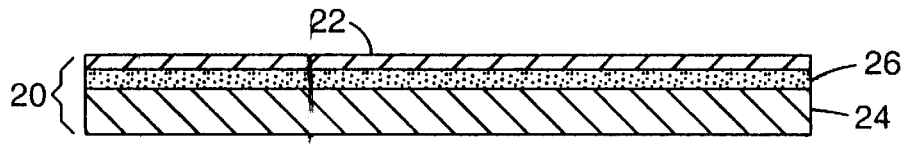
FIGS. 1a–1e are cross sectional views of a first method in accordance with the principles of the present invention.

Turning now to FIGS. 1a–1e, and specifically FIG. 1a, there is shown a precursor structure 20, that includes a metal foil 22 resting on a substrate 24 joined by an adhesive layer 26. It is preferred that the metal foil be of a low melting metal such as solder. It is preferred that the substrate 24 be a backing layer of a sheet of deformable, heat resistant material. The deformable, heat resistant, material used for the substrate layer 24 may vary widely depending on the intended application, but materials such as aluminum, polytetrafluoroethylene or the like are preferred.

A wide variety of adhesives may be used in the adhesive layer 26, including those which are thermoplastic (fusible), thermosetting (cure to a crosslinked infusible state), or combinations of both. One particular class of adhesives are those which are pressure-sensitive in nature. That is, they display permanent and aggressive tackiness to a wide variety of substrates at room temperature. Many pressure-sensitive adhesive materials are known in the adhesive art, and those that are suitable may comprise acrylate esters, acrylamides, thermoplastic elastomers, natural rubbers, olefins, silicones, vinyl ethers, esters, urethanes, etc., as well as selected polymers, and copolymers of these materials, and mixtures thereof.

Also useful in the invention are various thermosetting adhesives that can cure, for example, upon exposure to moisture, heat, radiation, etc. to an infusible, crosslinked state. Useful thermosetting adhesives include those formed by addition polymerization methods from, for example, polyesters, epoxies, urethanes, cyanoacrylates, as well as mixture of these components or polymers, copolymers, graft copolymers, and interpenetrating networks comprising these components.

While the composition of the adhesive layer 26 may vary widely depending on the intended application, the layer 26 is preferably a styrene-butadiene rubber based adhesive. The adhesive layer 26 may also include various chemical modifiers to provide utility required by a particular application; e.g., tackifiers, crosslinkers, stabilizers, initiators, etc.

The metal foil 22, substrate 24 and adhesive layer 26, are joined preferably by lamination or other similar techniques. Additionally, the adhesive layer 26 may include a flux, such as abietic acid, incorporated therein, to facilitate reflowing the metal foil 22 into balls (or bumps) 36" which are preferably substantially spherical in shape (FIG. 1e). The details of the re-flow process are described below.

Figure 1B:
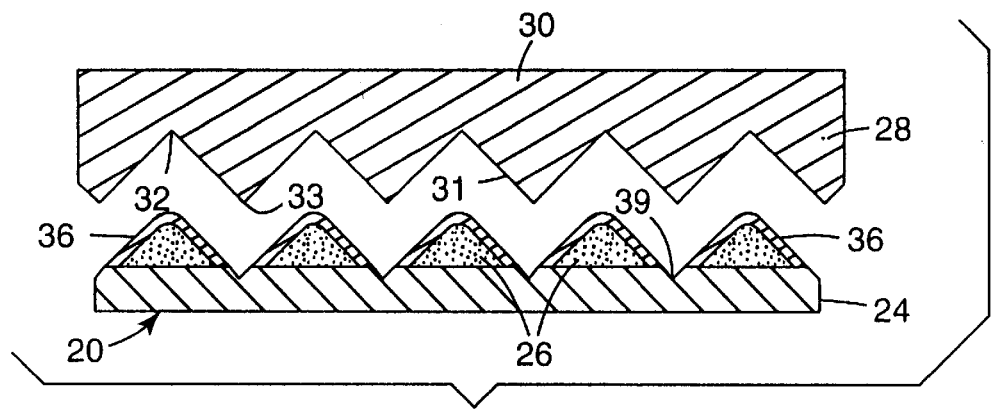

In FIG. 1b, the precursor element 20 is embossed, preferably by a nickel or other similar metal embossing tool 28. This embossing tool 28 shown in FIG. 2 has a body 30 with a surface 31 defining a plurality of depressions 32. The depressions 32 extend into the tool body 30 from a common surface plane. Preferably, the depressions 32 are inverse pyramid shaped and have uniform sizes and shapes. Of course, the depressions may be other shapes such as, for example, tetrahedral. The individual depressions 32 in the embossing tool 28 are separated or partitioned by a plurality of ridges 33 that preferably lie on a common plane and that form a rectangular or square grid pattern.

The subsequent contact and pressing together of the embossing tool 28 and the precursor structure 20, followed by their separation, results in the metal foil 22 being partitioned by the ridges 33 of the tool 28 into rectangular sections 36 corresponding to the grid pattern of the ridges 33. When the metal foil 22 is embossed, the embossing tool deforms the foil 22 such that the sections 36 form substantially pyramidal projections that mate with the pyramidal depressions 32 of the tool 28. Furthermore, the substrate 24 is preferably deformed by the ridges 33 such that partitioning grooves 39 separate each section 36. The projections need not have sharply pointed apexes. It is sufficient that the apexes lie in a common plane.

Throughout the specification and claims, various components are described as being "pyramidal." The term "pyramidal" or "pyramid shaped" is not intended to be limited to the literal definition of pyramid. Instead, such terms are intended to include generally pyramid shaped structures such as truncated pyramids or cones, pyramids or cones with rounded apexes, and other analogous shapes. The term "foil" is meant to include any metal layer, sheet, or coating of thickness less than about 0.2 mm. Such metal foils can be formed by rolling methods and also by deposition methods such as plating, evaporation, sputtering, or spraying.

In an optional but highly preferred step, a solder flux, such as, for example, the materials available under the trade designations Superlo Solids 26F from London Chemical Co., Kester Type SP593 from Litton, or Indalloy TACFLUX 007 from Indium Corporation may be applied to the embossed metal layer 22, by techniques such as spraying or knife coating. This flux facilitates the spheroidizing of the sections 36 into balls or bumps 36", having substantially spherical shapes (FIG. 1e). Alternately, should the adhesive layer 26 already include a flux, this step is unnecessary. However, the above mentioned fluxes may not be necessary if the metal is melted in an inert atmosphere, vacuum, or under conditions in which the oxides are dispersed, such as is possible with the use of ultrasound, or if the metal itself does not easily form an oxide, for example, gold.

Figure 1C:
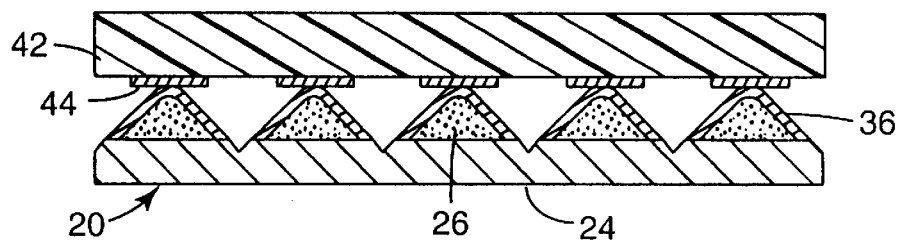
Figure 1D:
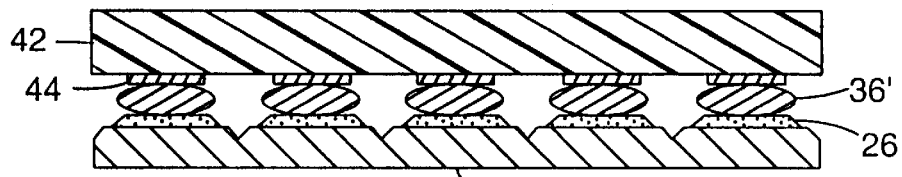
Figure 1E:
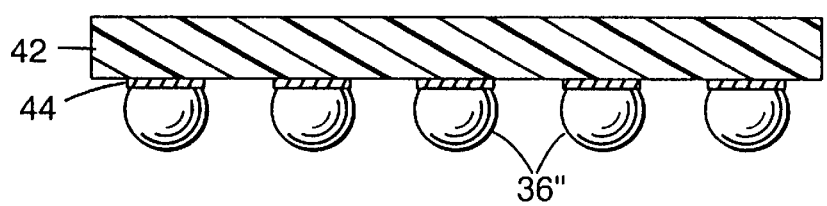

As shown in FIG. 1c, a circuit containing substrate 42, such as an electronic semiconductor package or microelectronic chip or the like, that includes pads 44 of an electrically conducting metal or the like (e.g., copper), is then aligned with the precursor element 20. The aligned circuit containing substrate 42 and the precursor structure 20 are then heated to a temperature where the metal of the sections 36 becomes molten. Surface tension causes the molten sections to consolidate into flattened spheres to minimize their total surface energy. The adhesive 26 may also change shape to accommodate the shape of the molten metal sections. Molten metal sections 36' are shown in FIG. 1d.

The pads 44 of the substrate 42 have greater affinity for the molten metal sections 36' than for the precursor structure 20. Consequently, upon removal of the precursor structure 20, the molten metal sections 36' are transferred to the pads 44 of the substrate 42 (as shown in FIG. 1e). The molten metal sections 36' cool and solidify on their respective pads 44 of the substrate 42 in a substantially spherical shape, as shown in FIG. 1e.

Figure 2:
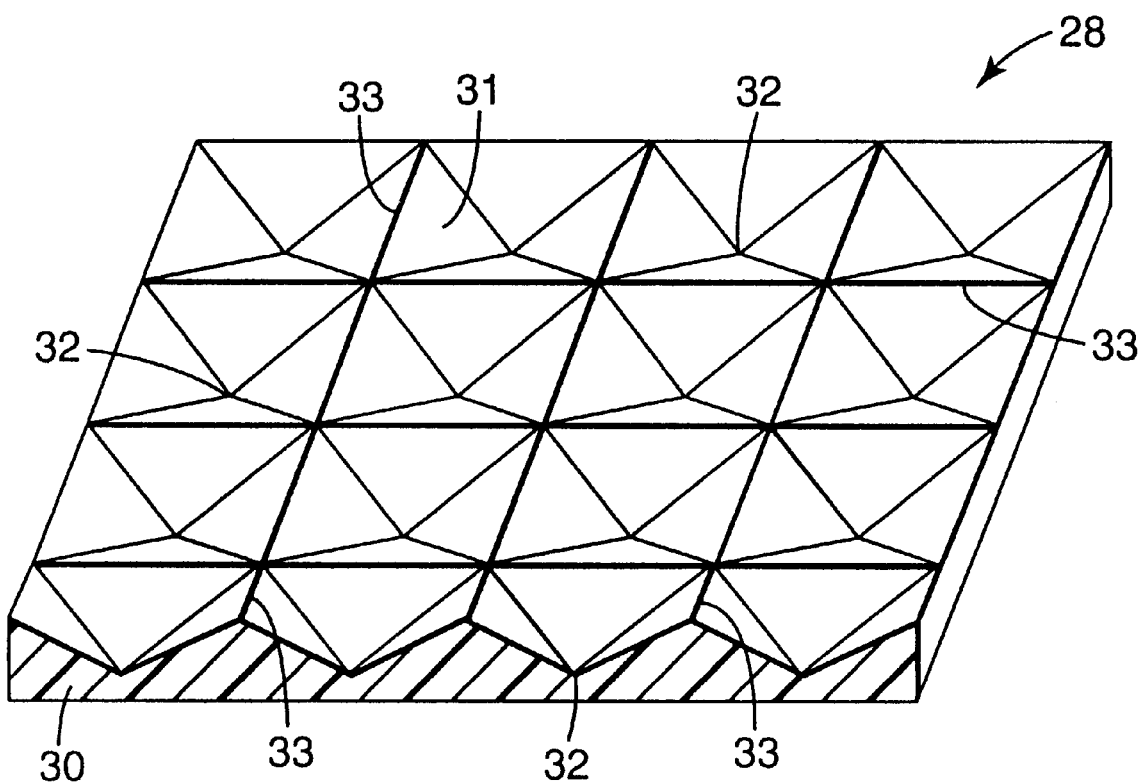
FIG. 2 is a perspective view of an embossing tool.
Figure 3A:
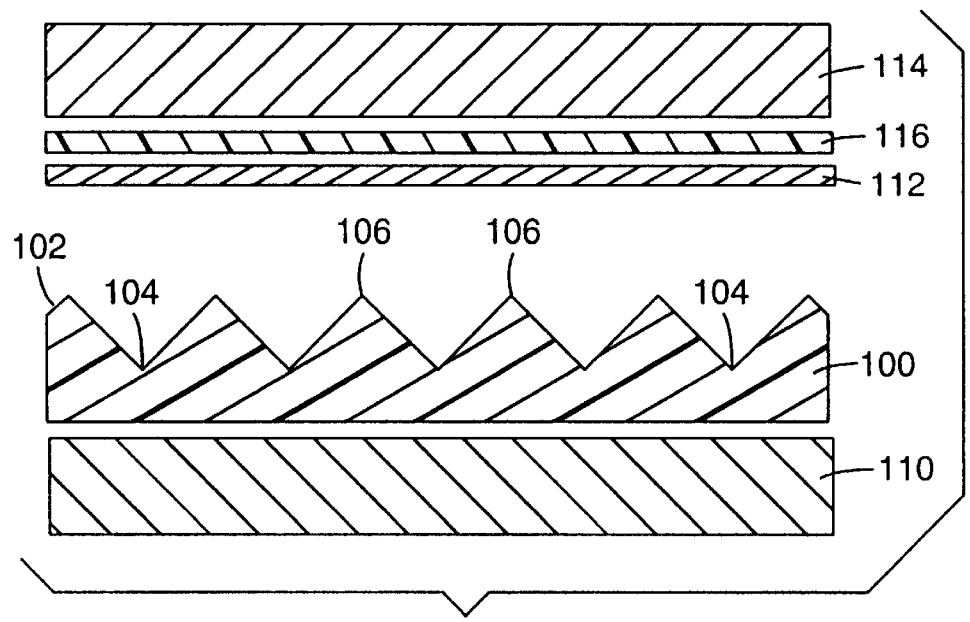
FIGS. 3a–3c are cross sectional views of a second method in accordance with the principles of the present invention.
Figure 3B:
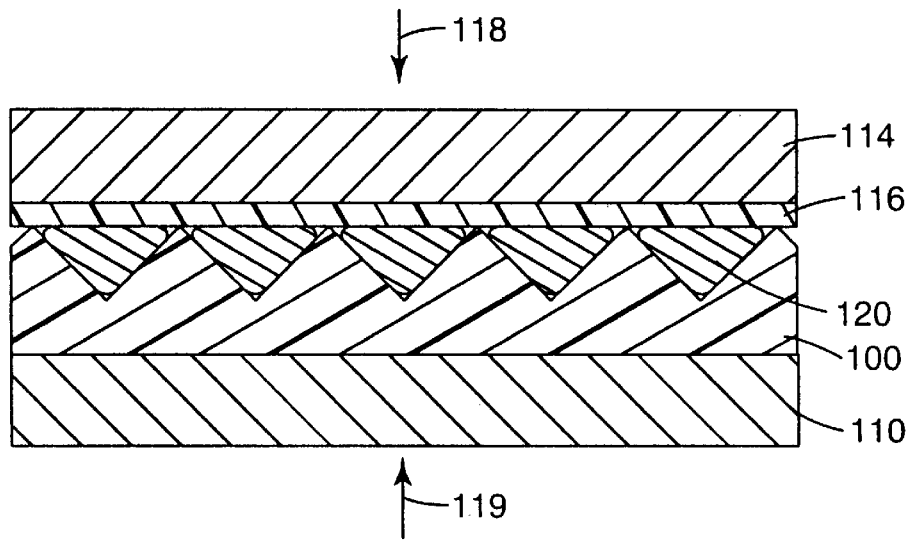
Figure 3C:
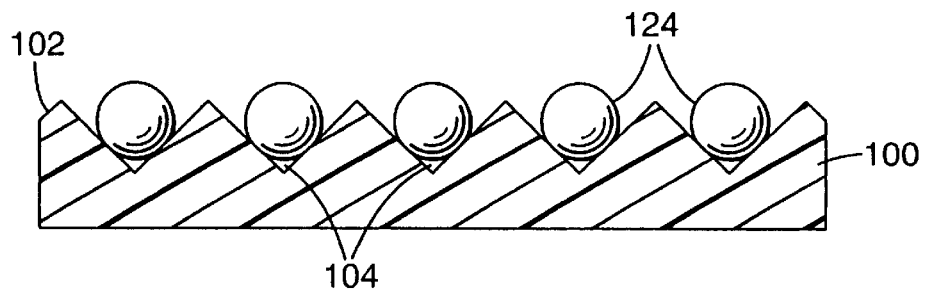

FIGS. 3a–3c show a second embodiment of the present invention. In FIG. 3a, there is shown an assembly with a substrate 100, preferably a backing sheet layer or a carrier tape, as described above, having a surface 102 defining a plurality of pyramid-shaped recesses 104 separated by a plurality of ridges 106 arranged in a rectangular grid configuration. For illustration purposes, the surface 102 of the substrate 100 has substantially the same configuration as the surface 31 of the embossing tool 28 of FIG. 2. While a rectangular grid of ridges is preferred, other geometries such as a grid forming triangles are also permissible.

The substrate 100 is placed on a lower platen 110 or other similar structure. A metal layer 112, preferably a solder foil sheet or other metal foil sheet as detailed above, is positioned above the substrate 100 and an upper platen 114, or other similar structure is positioned above the metal layer 112. It is preferred that there be a liner 116 of materials such as, for example, polyimide or polytetrafluoroethylene, intermediate the upper platen 114 and the metal layer 112. However, this liner sheet 116 may not be necessary if the upper platen 114 is made of or coated with a material which is not wet by the molten metal.

In an optional but highly preferred step, similar to that described above, a flux, may be applied to the metal layer 112, prior to its being brought into contact with the substrate 100. It is preferred that the flux be applied to both sides of the metal layer 102, although a single side is permissible. This is because an excess of flux usually remains in the recesses 104 and, as will be described later, helps to hold the balls 124 within the recesses 104 during subsequent handling.

Turning now to FIG. 3b, the platens 110, 114, as part of a platen press, are brought together by the application of pressure in the direction of the arrows 118, 119, to partition the metal layer 112 into sections 120, that form within the recesses 104 of the substrate surface 102. Heat, preferably at a temperature above the melting temperature of the metal of the metal layer 112, is applied to this assembly during the time the pressure from the platen press is separating the metal layer 112 into sections 120. The liner sheet 116 helps to confine the molten metal within the recesses 104.

The heat serves to make the metal sections 120 molten, such that upon separation of the platens 110 and 114, the molten metal sections 120 spheroidize to form balls 124 that are substantially spherical in shape (as shown in FIG. 3c). Preferably the pressure and heat are applied simultaneously, such that the metal layer 112 is partitioned into sections 120 and these sections concurrently/simultaneously become molten.

As shown in FIG. 3c, the substrate 100 is then removed from the platen press and allowed to cool. The resultant structure includes a substrate 100 that supports the resultant balls 124, preferably substantially spherical in shape, within the recesses 104, in substantially centered positions at a uniform distance with respect to each other. Excess flux may also be located within the recesses 104 to help maintain positioning of the balls 124. For this purpose a paste type flux such as those available under the trade designation Indalloy TACFLUX 007 or Kester SP593 are preferred. However, if there is adhesion between the balls 124 and the substrate 100, excess flux may not be necessary.

Figure 4:
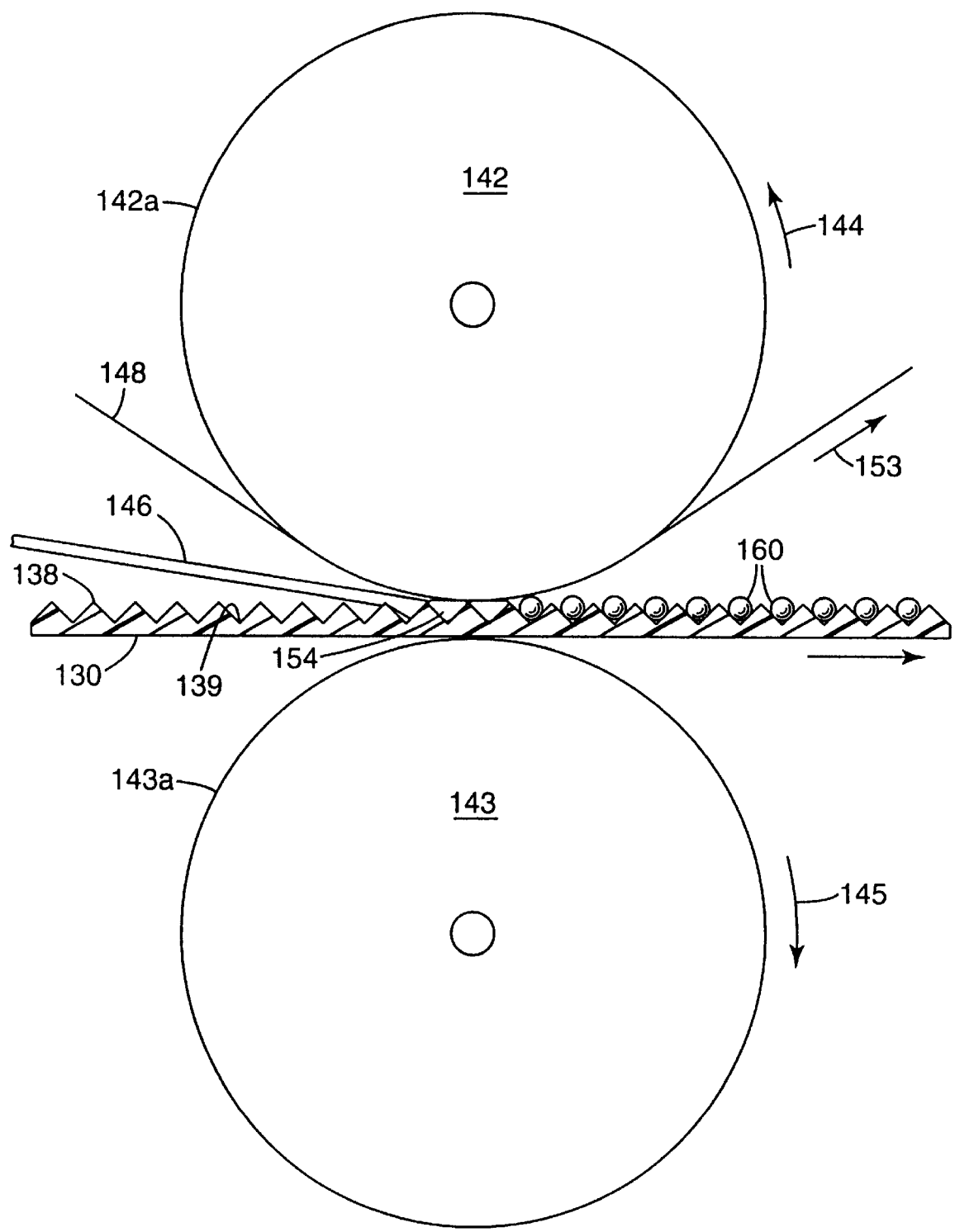
FIG. 4 is a cross sectional view of a third method in accordance with the principles of the present invention.

FIG. 4 details a process similar to that described above and shown in FIGS. 3a–3c. This process is automated for continuous production of metal balls, preferably of solder and substantially spherical in shape.

In FIG. 4, there is shown a patterned substrate 130, such as a carrier tape (sheet), as described above. The substrate 130 is patterned with a rectangular grid of ridges 138 separating a plurality of pyramidal recesses 139. The pattern on the substrate 130 is preferably similar to the pattern formed by the surface 31 of the embossing tool 28 of FIG. 2.

The substrate 130 is moved through a set of rollers 142, 143 both having smooth surfaces 142a, 143a and spaced apart a distance sufficient to provide pressure on the substrate 130, for the resultant operation. These rollers 142, 143 rotate in the direction of the respective arrows 144, 145. Either one, or preferably both of the rollers 142, 143, or the area around these rollers 142, 143 is heated to a temperature above the melting temperature of the metal layer 146, in order that the metal be completely molten prior to being cooled.

A metal layer 146 and a web sheet 148 are intermediate the rollers 142, 143. The metal layer 146 is fed from a feed roll (not shown) to a point between the rollers 142, 143. The web sheet 148 is fed from a feed roll (not shown) along the roller 142 and to a take-up roll (not shown), in the direction of the arrow 153. Under pressure of the rollers 142, 143, the metal layer 146 contacts the patterned substrate 130, such that the metal layer 146 is partitioned by the substrate 130 into sections 154 which are located within the recesses 139 of the substrate 130. This partitioning defines the spacing between the resultant balls 160. The web sheet 148 serves to confine these sections 154 in the recesses 139 of the substrate 130, when the sections 154 are between the rollers 142, 143, and prevents the molten metal section 154 and balls 160 from sticking to the upper roller 142.

Upon release of pressure from the rollers 142, 143 and the web sheet 148 (that goes to the take-up roll), the molten metal sections 154 spheroidize and cool into balls 160, substantially spherical in shape. These balls 160 are centered within the recesses 139 and are a uniform distance from each other.

The metal layer 146 is preferably a metal foil sheet, as described above, preferably of a solder foil. It is preferred that this metal layer 146 be treated with a flux, preferably on both sides, to assist in the spheroidization of the sections 154, as described above, into substantially spherical shaped balls 160 and if there is an excess of flux, this excess flux rests in the recesses 139, helping to hold the balls 160 within the recesses 139 during subsequent handling (as detailed above).

The web sheet 148, is preferably of a heat resistant material, and is similar to the protective liner 116 (FIGS. 3a and 3b), as described above. It is preferred that this web sheet 148 be heat resistant to temperatures above the melting point of the metal layer 146. Exemplary materials for this web sheet 148 include polyimide, fluoropolymers such as polytetrafluoroethylene (PTFE), perfluoroalpoxy resin (PFA), and fluoroethylene/propylene copolymer (FEP).

Depending upon the material used, the substrate 130 may be textured by thermal embossing against a textured tool having the inverse pattern of the tool shown in FIG. 2, that is, with a square pattern of pyramidal projections. Depending upon the material, the substrate 130 could also be textured by processes including thermal curing, thermal casting, casting with ultraviolet light curing, or solvent casting. Exemplary materials for the substrate 130 include fluoropolymers such as polytetrafluoroethylene (PTFE), perfluoroalpoxy (resin) (PFA), fluoroethylene-propylene copolymer (FEP), silicone rubbers, epoxies, and high temperature polymers such as polyetherether ketone (PEEK).

Figure 5A:
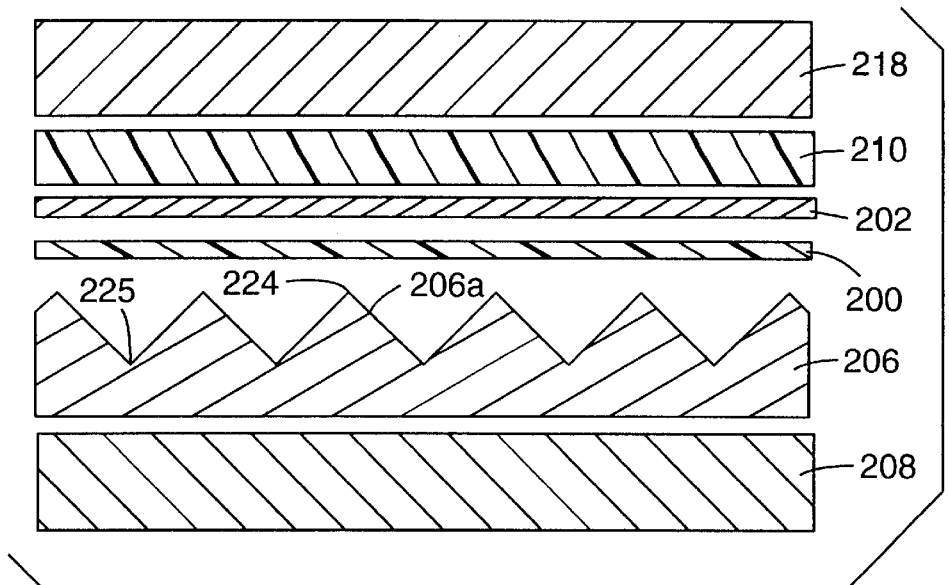
FIGS. 5a–5c are cross sectional views of a fourth method in accordance with the principles of the present invention.
Figure 5B:
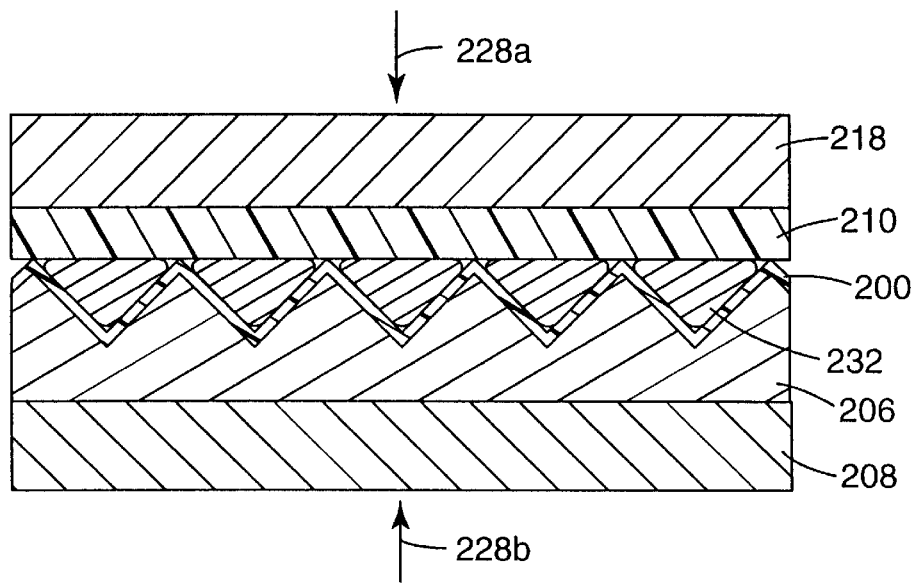
Figure 5C:
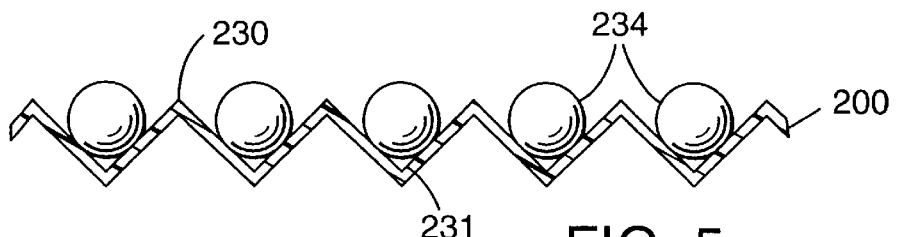
Figure 6:
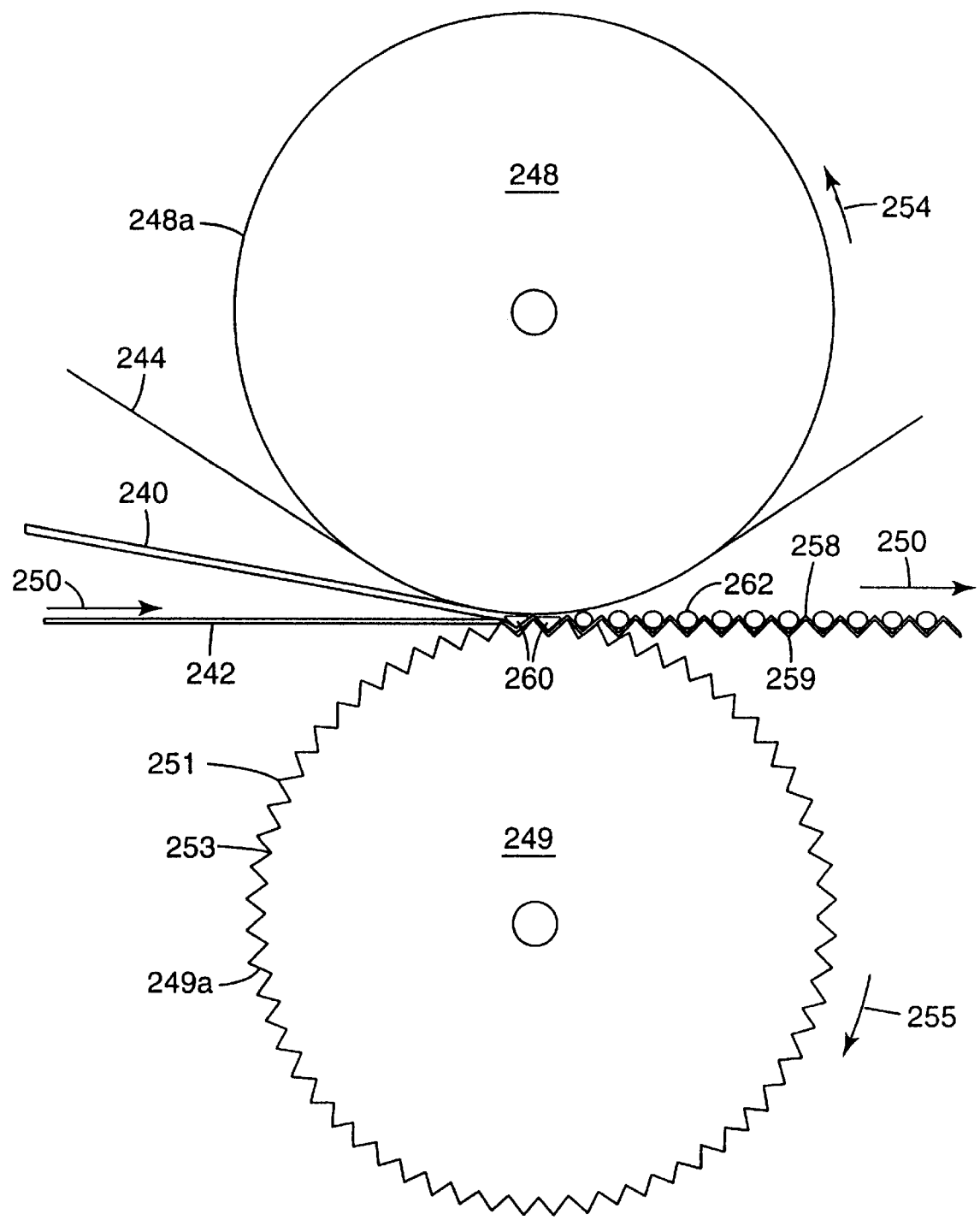
FIG. 6 is a cross sectional view of a fifth method in accordance with the principles of the present invention.

In FIGS. 5a–5c and 6, there are shown embodiments of the present invention, for producing substrates, preferably carrier tapes, containing metal balls, preferably of solder. In the disclosed processes, the substrate carrier tape is shaped at approximately the same time the metal layer (metal foil sheet) is partitioned into sections, and the sections are melted. Specifically, FIGS. 5a–5c show a batch process, while FIG. 6 shows a continuous process.

FIG. 5a shows an assembly where the substrate 200, preferably a carrier tape in accordance with the sheets of carrier tapes described above, is positioned intermediate a metal layer 202 and an embossing tool 206. The embossing tool 206 rests on a lower platen 208 of a platen press. A liner sheet 210 is preferably placed into this assembly intermediate the metal layer 202 and an upper platen 218 of the platen press.

The metal layer 202 is preferably a metal foil sheet, as described above, and preferably a solder foil sheet. The metal layer 202 is preferably coated on both sides with a flux, as described above, for the reasons discussed above.

The embossing tool 206 is made of a hard material such as nickel. The surface 206a of this embossing tool 206 is similar to the surface 31 of the embossing tool 28 shown in FIG. 2. This surface 206a includes a plurality of pyramidal recesses 225 separated by a plurality of ridges 224 arranged in a rectangular grid pattern.

In FIG. 5b, the platens 208, 218 are brought together by the application of pressure in the direction of the arrows 228a, 228b. The substrate 200 now assumes a configuration of ridges 230 and recesses 231 corresponding to the shape of the surface 206a of the embossing tool 206. Heat, preferably at a temperature above the melting temperature of the metal layer 202 is applied to this assembly while the metal layer 202 is partitioned into sections 232 by the assembly. The sections 232 are confined within the recesses 231 of the substrate 200 by the liner sheet 210, that rests on the ridges 230. The liner sheet 210 has the function of preventing the molten metal from wetting and sticking to the platen 218. It also has the function of distributing compressive stresses evenly over the area of the metal foil 202 and substrate 200 causing the substrate to conform to the pattern of the embossing tool 206. The liner sheet may be made of a deformable or elastic material with heat resistance such as, for example, silicone rubber or polyfluoroethylene. Heat serves to make the metal sections 232 molten.

In FIG. 5c, the pressure from the platens 208, 218 of the platen press has been released and the substrate 200 has been removed from the platen press for cooling. Upon release of pressure, the molten metal sections 232, preferably facilitated by the flux (as detailed above), spheroidize, forming balls 234, substantially spherical in shape. The resultant metal balls 234 within the recesses 231, are in substantially centered positions at a uniform distance with respect to each other.

In FIG. 6, a metal layer 240, as described above, preferably a metal foil sheet (e.g., solder foil sheet), with at least one side, but preferably both, coated with a flux, as described above, is positioned intermediate a substrate 242, preferably a sheet of a carrier tape, as described above, and a liner sheet 244, similar to the liner sheet 210 (FIGS. 5a, 5b) as described above. The metal layer 240, substrate 242, and liner sheet 244 are aligned so as to be pressed between rollers 248, 249.

The metal layer 240 is fed from a feed roll (not shown) along a guide (not shown) in the direction of the arrow 250 to a point between the rollers 248, 249. Similarly, the substrate 242 and liner sheet 244 are fed from their respective feed rolls (not shown) to their respective take up mechanisms (not shown) beyond the rollers 248, 249.

The upper roller 248, has a smooth surface 248a and the lower roller 249, has a surface 249a of ridges 251, separating a plurality of recesses 253, as described above, and in particular has a surface corresponding to that of the tool 28 of FIG. 2. These rollers 248, 249 are preferably both heated to a temperature above the melting temperature of the metal layer 240, although only one of the rollers 248, 249 needs to be heated to this temperature. The rollers 248, 249 are designed to rotate in the direction of the respective arrows 254, 255.

Specifically, as the rollers 248, 249 rotate in the direction of the arrows 254, 255 the metal layer 240, substrate 242, and liner sheet 244 move together, in the direction of the arrow 250. At a point where the rollers 248, 249 are spaced apart so as to exert sufficient pressure on the metal layer 240, substrate 242, and liner sheet 244, the substrate 242 is embossed (to correspond with the shape of the surface 249a of the lower roller 249) such that elements of ridges 258 and recesses 259 are formed thereon. Almost simultaneously, the metal layer 240 is locally melted and partitioned into sections 260, that are confined within the recesses 259 by the liner sheet 244. Almost instantly, the metal sections 260 become completely molten.

The pressure from the rollers 248, 249 releases as the substrate 242 moves forward in the direction of the arrow 250. Upon release of pressure, the molten metal sections 260, preferably facilitated by the flux, spheroidize to form balls 262, substantially spherical in shape, that are centered in the recesses 259 and at a uniform distance with respect to each other, on the substrate 242.

In FIGS. 3–6 the relationship between the thickness of the metal foil versus the volume of the recesses in the pattern of the carrier substrate is important. To obtain the most uniform metal ball size, the thickness of the metal foil should not exceed a value in which the resulting volume of metal completely fills the volume of the recesses in the carrier substrate. Preferably the foil thickness should be slightly less than this volume. If the metal foil is too thick the excess molten metal flows out at the edge of the platens or, for the case of the rollers in FIGS. 4 and 6 forms a puddle in front of the contact area where the carrier substrate first comes into contact with the rollers. This excess molten metal pulls metal from the recesses as it flows to the edge of the platens or rollers due to the lessening of total surface energy that result when the metal accumulates in larger pools. This effect is hard to control and results in nonuniform balls.

Figure 7A:
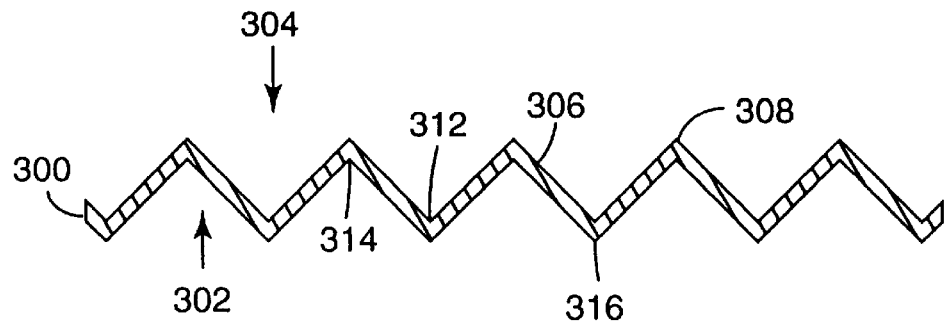
FIGS. 7a–7e are cross sectional views of an sixth method in accordance with the principles of the present invention.

FIGS. 7a–7e illustrate another method for making an array of metal balls in accordance with the principles of the present invention. FIG. 7a illustrates a metal foil 300 having a front side 302 opposite from a back side 304. The foil 300 has been embossed or patterned by any one of the techniques previously disclosed in the specification, or by any other known technique for patterning a member. The patterned back side 304 of the foil 300 includes a plurality of projections 306. Preferably, the projections 306 are pyramid shaped and have apexes 308. The projections 306 are separated by a plurality of grooves 312 that are arranged to form a rectangular grid pattern. The front side 302 of the foil 300 has an inverse relationship with respect to the back side 304 of the foil 300. Consequently, the front side 302 preferably includes a plurality of pyramid shaped recesses 314 that correspond to the pyramid shaped projections 306 of the back side 304. Additionally, the recesses 314 are separated by a plurality of ridges 316 that correspond to the grooves 312 of the back side 304. The ridges 316 are preferably arranged to form a rectangular grid pattern and are aligned along a common plane.

Figure 7B:
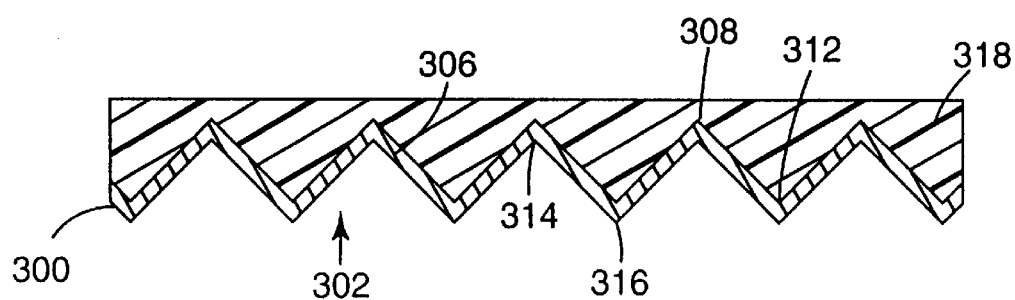

Once the patterned metal foil 300 has been provided, the back side 304 of the metal foil 300 is covered with a backing material 318. As shown in FIG. 7b, the backing material 318 covers the apexes 308 of the projections 306 and fills the grooves 312. The backing material 318 can be placed, sprayed, spread, or otherwise applied to the back side 304 of the foil 300. Preferably, the backing material 318 is a flowable material such as, for example, an uncured liquid thermoset polymer, preferably and uncured epoxy.

Figure 7C:
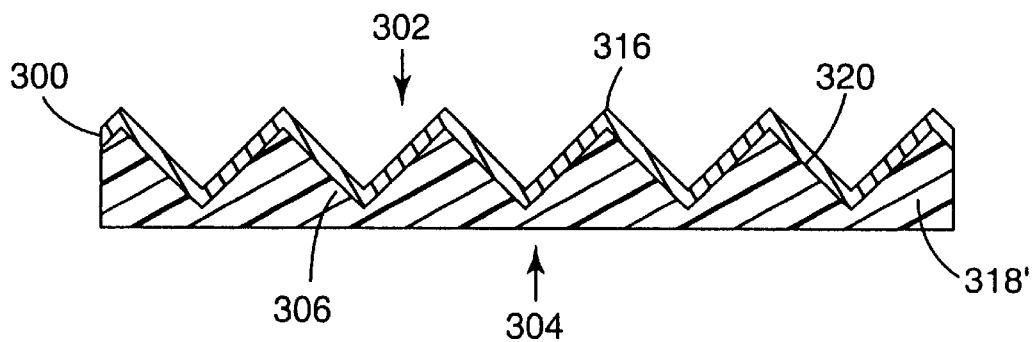

After the back side 304 of the foil 300 has been covered with the backing material 318, the backing material 318 is cured or otherwise hardened and the foil 300 is turned over as shown in FIG. 7c. The hardened backing material 318 forms a carrier substrate 318' such as a carrier tape, film or sheet. The carrier substrate 318' defines a plurality of pyramidal recesses 320 that form a grid having a rectangular pattern. Each pyramid shaped projection 306 of the foil 300 is oriented within a corresponding recess 320 of the carrier substrate 318'.

Figure 7D:
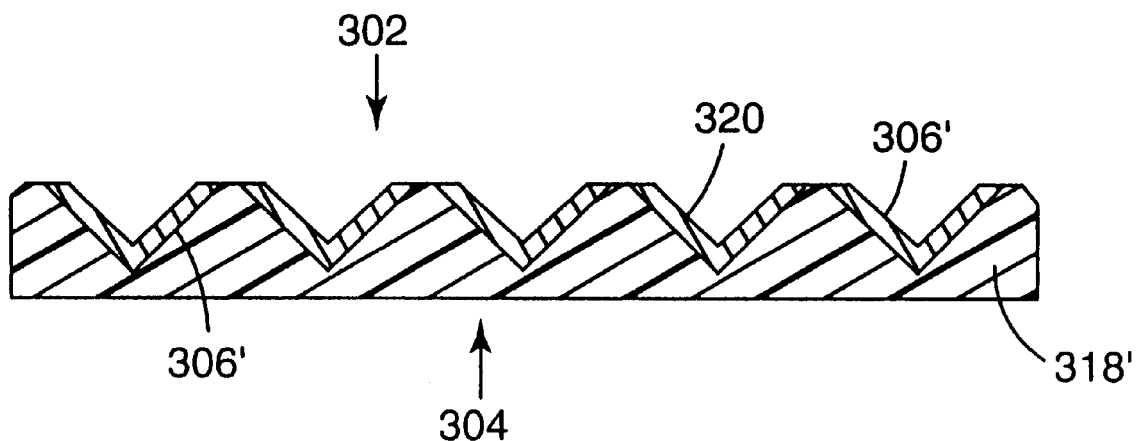
Figure 7E:
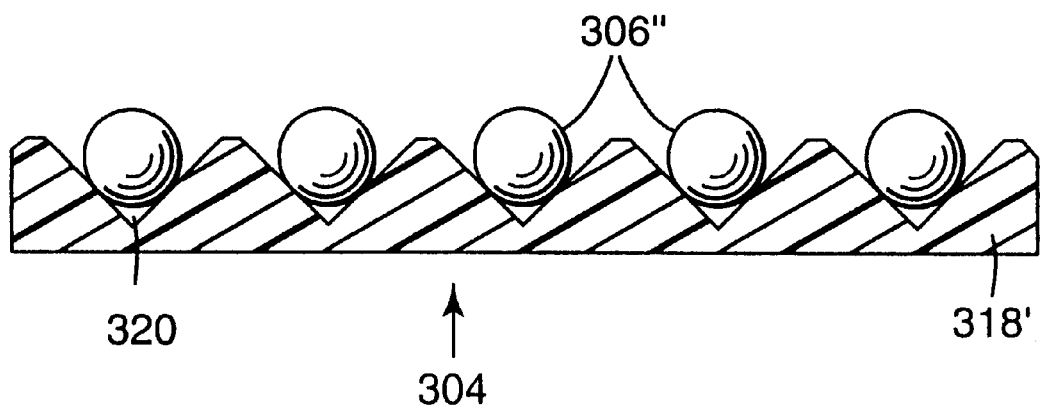

Next, as shown in FIG. 7d, the ridges 316 on the front side 302 of the foil 300 are removed such that the pyramid shaped projections 306 are partitioned into discrete sections 306' contained within the recesses 320 of the carrier substrate 318'. It will be appreciated that the solder at the ridges 316 can be removed or displaced by abrasion or any number of alternative techniques including embossing or cutting with a sharp ridged embossing tool or localized melting of just the solder ridges. Finally, as shown in FIG. 7e, the discrete sections 306' are melted to form individual balls 306" positioned within the recesses 320 of the carrier substrate 318'. Preferably, a solder flux is used to enable the sections 306' to form balls 306". Additionally, bonding can occur between the balls 306" and the substrate 318' to retain the balls 306" in the recesses 320 of the substrate 318".

It will be appreciated that if, in the process shown in FIG. 7b, a thinner layer of backing material is used to cover the back side of the metal foil, the resulting metal balls can be exposed or nearly exposed on the back side of the resulting carrier substrate. This is advantageous because there is less thermal mass in the carrier substrate and the metal balls can be transferred to a circuit with less heating or by simply placing the ball array in registry with a circuit and pressing a hot thermode against the back side.

The recesses 320 of the carrier substrate 318' align the balls 306" in a precise solder ball array, protect the balls 306" from damage and prevent the balls of the array from moving relative to one another. The recesses serve as reservoirs to confine the solder balls and prevent adjacent balls from coalescing together when they become molten if, during operations to transfer the solder balls to a circuit, excessive pressure is applied to the carrier substrate 318' when it is placed against a circuit board, electronic package or IC chip. The above method is relatively inexpensive and yields solder balls having uniform dimensions which are precisely aligned in an array suitable for providing a connection between an electronic package and a substrate or between an integrated circuit chip and an electronic package.

The configuration shown in FIG. 7c can be attained by other means besides patterning a metal foil and then casting a backing material to form a carrier substrate on the backside of the metal foil. For example, a carrier substrate and metal foil can be patterned separately with the same pattern and then adhered together so that the projections of the backside of the patterned metal foil or sheet fit into the recesses of the patterned carrier substrate. The attachment of the metal foil to the carrier substrate can be enhanced by the use of a thin layer of an adhesive between the foil and the substrate. One advantage of using this method to attain the configuration of FIG. 7c is that the carrier substrate can be a high temperature thermoformable material which allows the carrier substrate to be pre-embossed at temperatures which would prematurely melt the metal foil if the carrier substrate were in contact with the metal foil.

Alternatively, the configuration of FIG. 7c can be obtained by first patterning the carrier substrate and then vapor coating the patterned surface of the substrate with a metal so that the metal forms a continuous coating on the patterned surface of the substrate. This alternative is especially attractive as a means to obtain fine size scale arrays of balls after partitioning and melting steps shown in FIGS. 7d and 7e. For most metals, rolling to form a foil of less than approximately 5 microns thickness is difficult. Vapor coating by, for example, evaporation of the metal can be more economical for metal coating thicknesses below approximately 5 microns.

The partitioning step illustrated in FIG. 7d may, under certain conditions, be combined with the melting step shown in FIG. 7e if the partitioning is done by melting the metal at the ridges 316 using, for example, radiant heaters or flames or momentary contact with a hot surface. It is necessary for the heat to be applied from the front side 302 of the metal layer and that the heat source be strong enough and the application of heat be rapid enough to establish a temperature gradient from the front side 302 of the metal layer at the ridges 316 to the back side of the metal layer at the recesses 314. The ridges 316 of the metal layer need to be the first portion of the metal layer to melt. As the metal layer at the ridges melts, the surface tension of the molten metal causes the metal to pull away from the ridges 316 and flow inward toward the recesses 320 in the carrier substrate, effectively partitioning the metal layer into sections just prior to complete melting.

To enhance the thermal gradient it is advantageous that the metal layer and substrate be in intimate contact during melting of the metal layer and that the carrier substrate be relatively cool or in contact with a relatively cool supporting surface. By intimate contact is meant sufficient contact to enable substantial conduction of heat across the metal layer/carrier substrate interface. This contact can be enhanced if there is bonding between the metal layer and carrier substrate.

To aid in spheroidizing the solder or low melting metal sections into balls, it may be helpful to have a solder flux on the front surface of the metal layer. The flux can also enhance the temperature gradient if the flux is applied so that it is thicker at the recesses 314 compared to the ridges 316 of the metal layer, thus providing an additional thermal sink in the area of the recesses 314. Suitable fluxes include those available from Litton under the trade designations Kester SP 596 or SP 2163.

Suitable substrate materials for low melting metals such as tin, lead, and indium include, for example, epoxies such as those available from 3M Company under the trade designation #2216 and metals such as aluminum with adherent surface oxides which are not easily wet by low melting metals. Prior to melting it is advantageous that the metal at the ridges be as thin as possible and the ridges of the carrier be as sharp as possible to enable equal separation of the molten metal into the recesses adjacent to the ridges. If the metal is a relatively soft metal such as tin, lead, indium, or gold and if the carrier substrate is hard relative to these metals, the thickness of the metal at the ridges can be reduced by compression of the metal/carrier substrate assembly between two smooth platens or rollers.

The methods illustrated in FIGS. 3–6, while requiring fewer process steps than the process outlined in FIGS. 7a–7e, require a more stringent uniformity in carrier substrate thickness, pressure, temperature, and in FIGS. 4 and 6, rolling speed to obtain uniform size balls. In the method of FIGS. 7a–7e the partitioning step of FIG. 7d enables more reproducible control over metal ball uniformity.

Figure 8A:
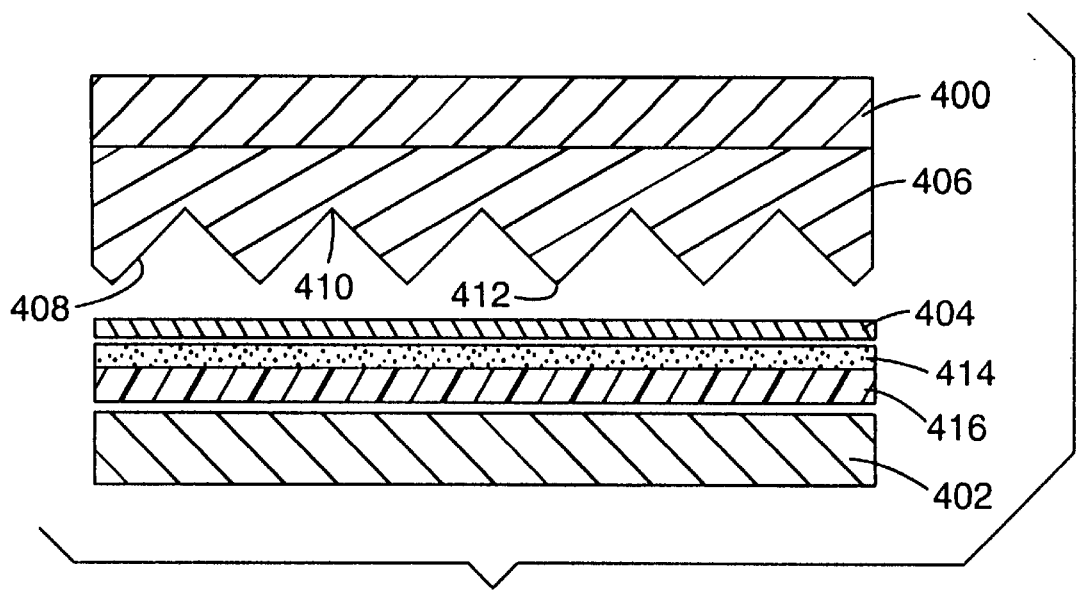
FIGS. 8a–8f are cross sectional views of a seventh method in accordance with the principles of the present invention.

FIGS. 8a–8f illustrate a further method for making an array of metal balls in accordance with the principles of the present invention. FIG. 8a shows an assembly suitable for practicing the present invention. The assembly includes a platen press including a top platen 400 and a bottom platen 402. A metal foil 404 is positioned between the top and bottom platens 400 and 402. An embossing tool 406 having a female patterned embossing surface 408 that faces a back side of the foil 404 is positioned between the top platen 400 and the foil 404. The female patterned embossing surface 408 includes a plurality of pyramid-shaped recesses 410 separated by a plurality of ridges 412 arranged to form a rectangular grid array similar to the tool shown in FIG. 2. The assembly also includes a compliant layer 414 positioned adjacent to a front side of the foil 404 and a temporary backing layer 416 positioned between the compliant layer 414 and the bottom platen 402.

Figure 8B:
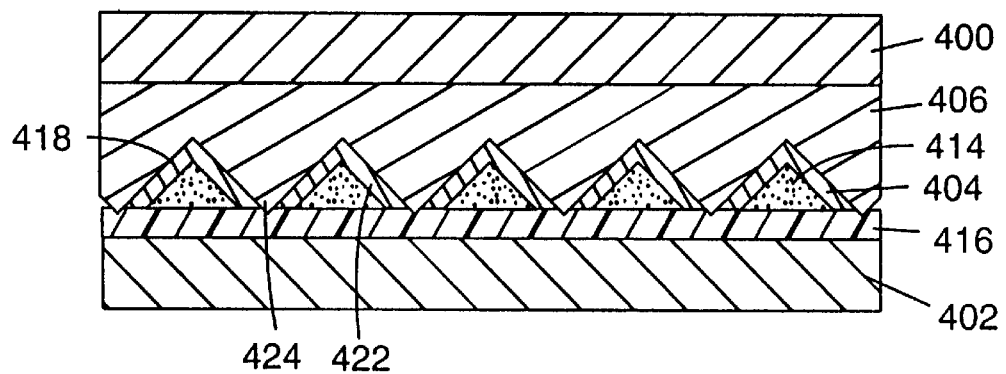

In practicing the method, as shown in FIG. 8b, the top and bottom platens 400 and 402 are pressed together such that the female embossing surface 408 embosses the foil 404. The embossing tool 406 is preferably pressed against the foil 404 with sufficient pressure that the ridges 412 cut completely through the foil 404 and compliant layer 414, and partially into the temporary backing layer 416. As embossed, the back side of the foil 404 has a plurality of pyramid shaped projections 418 which are separated by a plurality of grooves 420 arranged to form a rectangular grid. The front side of the foil 404 has an inverse relationship with respect to the back side and includes a plurality of pyramid shaped recesses 422 that are separated by a plurality of cut ridges 424 arranged in a rectangular grid configuration. The cut ridges 424 are connected to the temporary backing 416 and the compliant layer 414 is partitioned within the pyramid shaped recesses 422 on the front side of the foil 404.

Figure 8C:
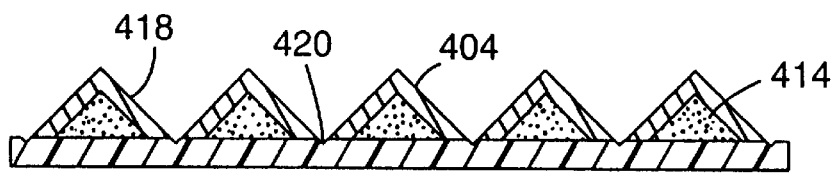
Figure 8D:
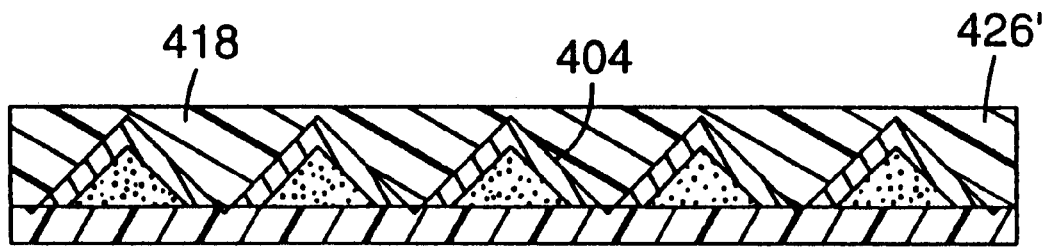

Once the foil 404 has been embossed, the foil 404, compliant layer 414 and the temporary backing 416 are removed from the press. Although the foil 404 and compliant layer 414 have been partitioned or cut by the embossing tool 406, the partitioned regions are held together by the temporary backing 416 as shown in FIG. 8c. The partitioned foil 404, compliant layer 414, and temporary backing 416 are similar to the metal layer 36, adhesive 26, and substrate 24 respectively of FIG. 1B, except in this case, the compliant layer 414 and temporary backing 416 need not be heat resistant. Suitable materials for the compliant layer include latex adhesives, wax, or repositionable adhesives such as those available from 3M Company under the trade designation ReMount. Suitable materials for the temporary backing include soft, inexpensive polymers such as, for example, polyvinyl chloride (PVC), polyethylene, or polypropylene. As shown in FIG. 8d, the back side of the foil 404 is then preferably covered with a thermoset backing material such that the pyramid shaped projections 418 of the foil 404 are covered. The thermoset backing material is then cured or hardened such that the thermoset backing material forms a carrier substrate 426'. The carrier substrate 426' has pyramid shaped recesses 428 in which the partitioned projections 418 of the foil 404 are contained.

Figure 8E:
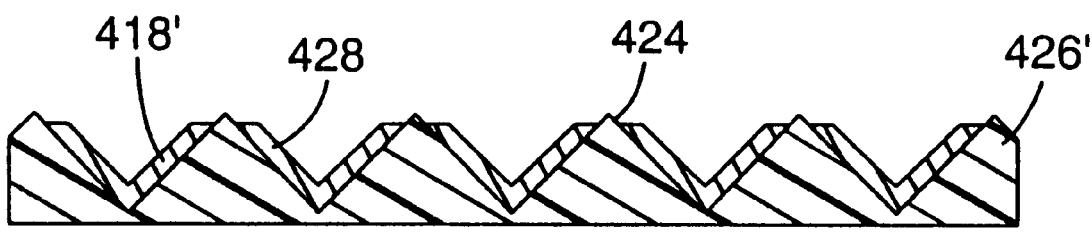
Figure 8F:
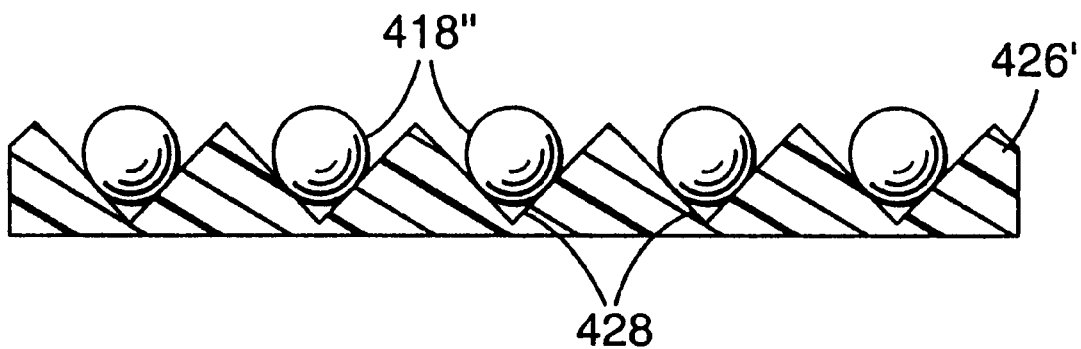

Referring to FIG. 8e, the foil 404 is then turned over and the temporary backing 416 and the compliant layer 414 are removed from the front side of the foil 404. Once the temporary backing 416 is removed, the cut ridges 424 of the foil 404 are exposed. It will be appreciated that because the ridges 412 of the embossing tool 406 cut completely through the foil 404 during embossing, the pyramid shaped projections 418 of the foil 404 are partitioned into discrete sections 418' contained within the recesses 428 of the carrier substrate 426'. Finally, as shown in FIG. 8f, the discrete sections 418' are melted to form individual balls 418" positioned within the recesses 428 of the carrier substrate 426'. Preferably, a solder flux is used to enable the sections 418' to form balls 418".

EXAMPLE 1

A 63/37 tin/lead eutectic solder foil of 0.064 mm thickness and 102 mm width was purchased from Lucas-Milhaupt, Inc., Cudahy, Wis. A 102 mm×607 mm piece of the foil was placed against a pressure sensitive adhesive (PSA) coated aluminum sheet of the same size. The aluminum was 0.13 mm in thickness and had 0.05 mm of adhesive (2 parts styrene butadiene rubber, 1 part acrylate) on the side to which the solder foil was bonded. This aluminum/PSA sheet is commercially available from 3M Corporation, St. Paul, Minn. as Industrial Tape and Specialties Division Tape No. 417. The solder foil and aluminum/PSA sheet were joined by standard lamination techniques.

Figure 9:
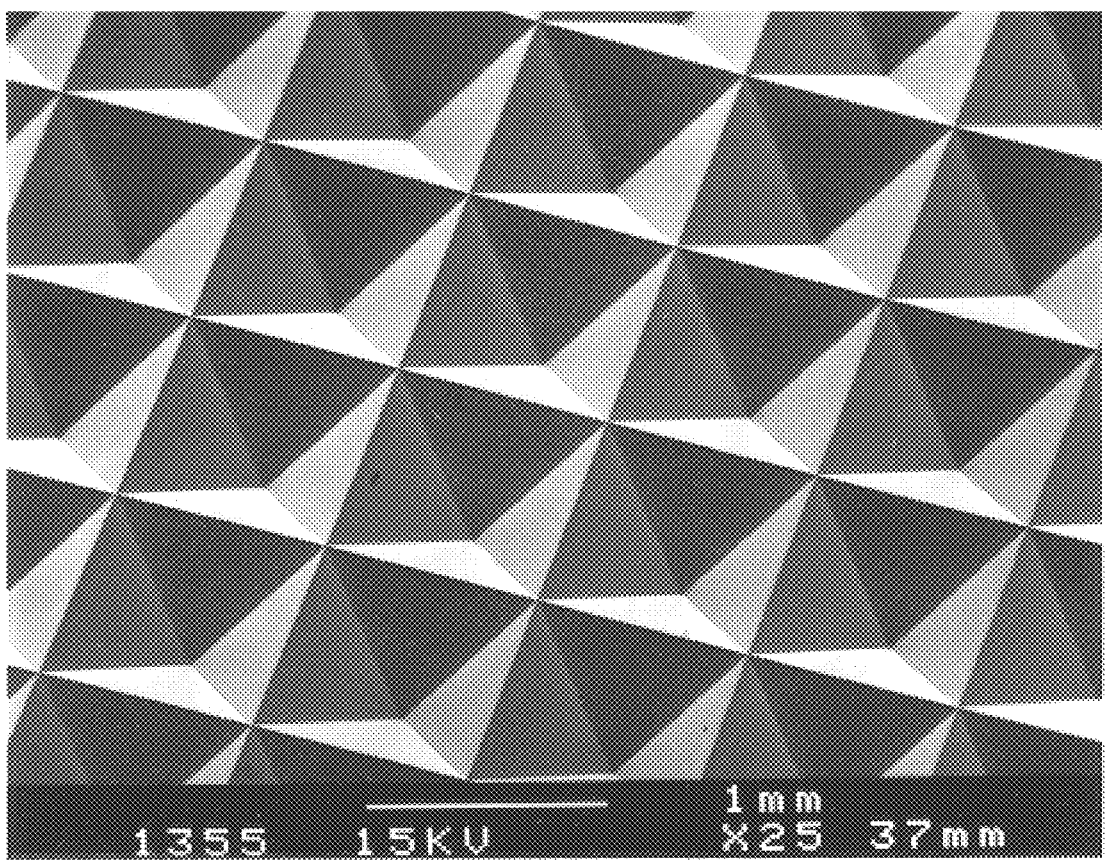
FIG. 9 is a scanning electron micrograph of an embossing tool used in the present invention.
Figure 10:
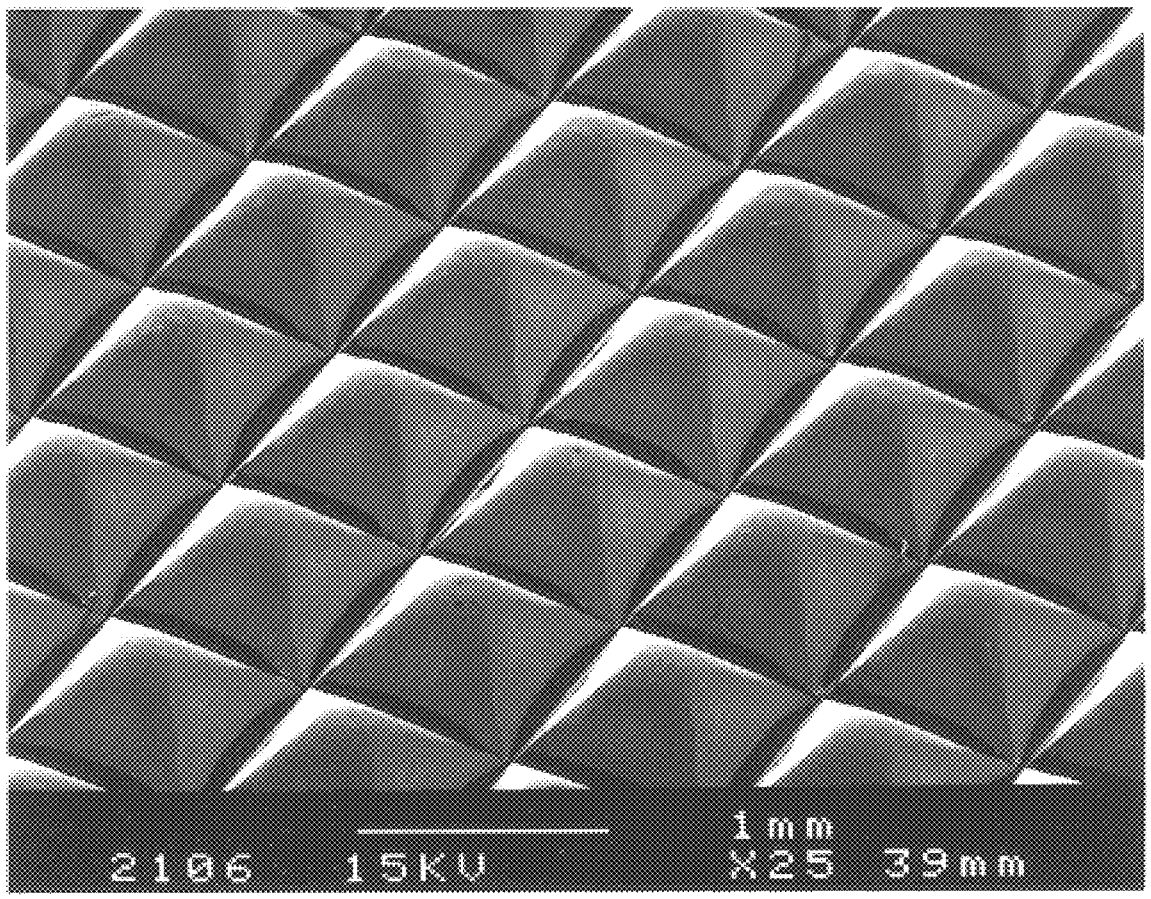

A 38 mm×76 mm piece of this laminated sample was placed against a nickel embossing die. A micrograph of this die is shown in FIG. 9. The pattern of this die is similar to the drawing of FIG. 2. The die consisted of a square ridge pattern defining four-sided (square based) inverted pyramids with an 80 degree internal angle for the ridges and 0.89 mm spacing between the ridges. The die was electroformed from a diamond machined pattern in acrylic plastic. The embossing die and the solder/aluminum PSA lamination were passed through a rolling mill with sufficient pressure to cut the foil into separate and discrete sections. Although the force on the rolling mill was not measured, the degree of embossing was similar to that of pieces embossed with a pressure of 34 MPa in a platen press. A micrograph of the embossed solder foil section is shown in FIG. 10. It was important that the solder sections be completely severed apart from their neighbors during the embossing step; otherwise during subsequent melting two adjacent sections can coalesce together to form a single ball. The resulting three-dimensional shape of the embossed solder sections is dependent on the rigidity and thickness of the underlying adhesive used to bond the solder foil to the aluminum backing. When the adhesive is rigid and hard, such as a cured epoxy, the resulting solder squares are relatively flat. Softer adhesives such as PSAs result in the sections projecting up at their mid-sections to form four-sided (square based) pyramids in conformity to the shape of the recesses in the embossing tool. Soft adhesives, and to an extent, the soft aluminum backing also help the sections to completely sever at lower embossing pressures.

Substrates containing bare copper pads for use as test substrates were made in two ways. One way was to apply a dry film solder mask available from Morton Electronics Products under the trade designation Dynamask Aqueous solder mask type 5030 (a negative acting photoimagable solder mask), to a copper coated FR-4 board, expose a 0.89 mm pitch dot pattern onto the mask, and develop and cure the mask according to the product specifications. The solder mask was removed everywhere it was not exposed to TV light leaving behind a pattern of 0.46 mm diameter, 0.08 mm deep holes with copper exposed on the bottoms. An alternate method for making this substrate was to use photolithographic and electroplating techniques to make a dot pattern of 0.05 mm high, 0.36 mm diameter copper pads spaced 0.89 mm apart on polyimide. These substrates, called Ball Grid Array (BGA) substrates, allowed testing of methods for transferring solder balls to a circuit.

It was necessary to register or align the embossed solder pyramids to the copper pads of the BGA substrates. In the case of the solder mask BGA substrate, the pads were recessed and the embossed solder substrate was slid around against the BGA substrate until the points of the pyramids dropped into the recesses of the pads. Locking between the pads and pyramids was observed. In the case of the copper on polyimide BGA substrates, the dot pattern of the pads could be viewed through the polyimide and made to coincide with the peaks of the pyramids.

The easiest method to register or align both types of BGA substrates was to pre-cut the embossed foil sample and the BGA substrate to the same size with the array of pads and the array of solder pyramids having the same location in the cut pieces. The arrays of pyramids and pads then lined up when the pieces were placed against each other with their edges aligned.

Before the embossed solder foil (FIG. 10) was placed against the BGA substrate, a no-clean solder flux, available under the trade designation Superlo Solids 26F from London Chemical Company, was applied to both the embossed foil and the BGA substrate. This solder flux was sprayed from an aerosol bottle for less than 0.5 sec from a distance of roughly 1 ft (30 cm). The flux tended to settle into the embossed recesses.

Figure 11:
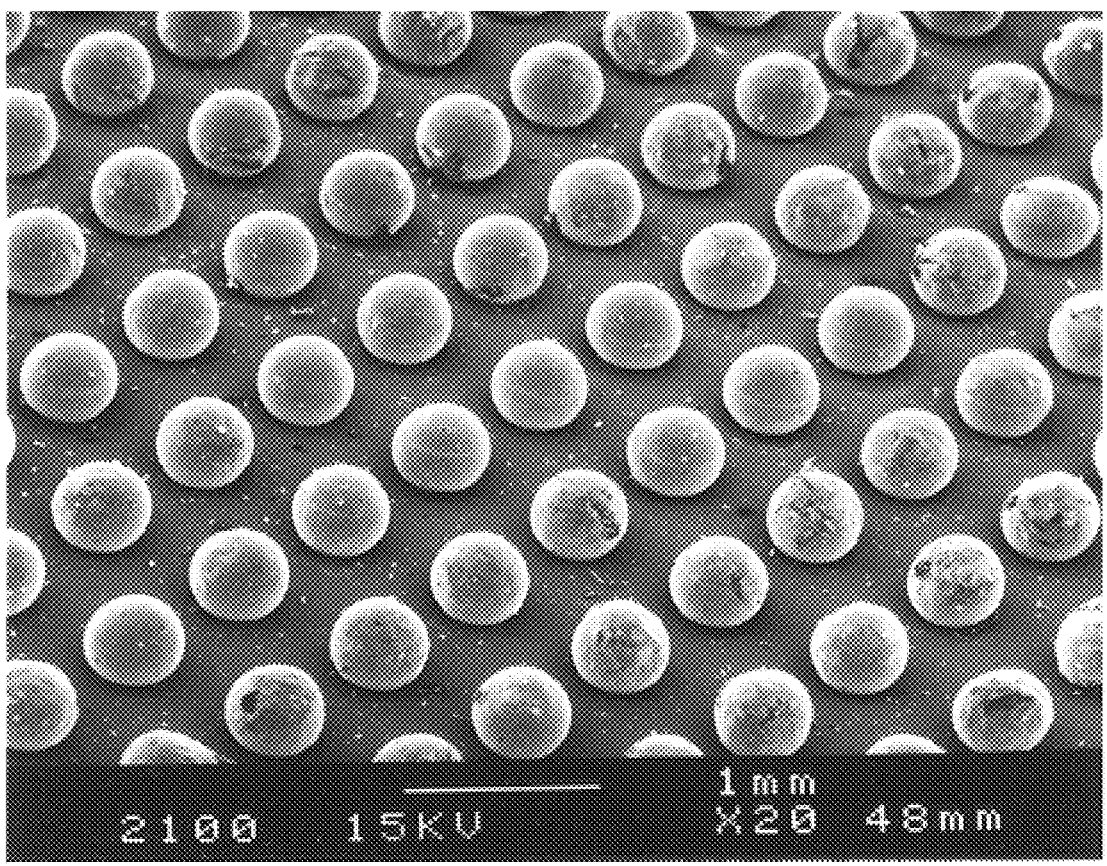

The BGA substrate was anchored to a flat surface using a silicone pressure sensitive adhesive (available under the trade designation CW-14HT, from Ospecialty Tapes, Division of RSW, Inc.) and the embossed solder with its aluminum backing tape was placed against the BGA substrate so that the solder sections were in contact with the copper pads of the BGA substrate. A 12.7 mm by 25.4 mm by 25.4 mm piece of aluminum was heated on a hot plate to 300° C. and then placed against the backside of the aluminum tape for 10 seconds. It was then removed and almost simultaneously the aluminum tapes was carefully peeled off the BGA substrate, taking care not to disturb or smear the molten solder balls which were now adhered to the BGA substrate. FIG. 11 shows an SEM micrograph of the resulting sample, with a field of view tilted 30° form the plane of the sample.

During the melting step the surface tension of the molten solder balls provides a standoff pressure which resists the application pressure. This standoff pressure increases as the molten balls are flattened. If too much pressure is applied, roughly 1.5 kPa, the molten solder from adjacent solder sections coalesces together. The steel weight used in this example provided a suitable pressure of 265 Pa.

EXAMPLE 2

A 50 mm×300 mm×2 mm nickel embossing tool was fabricated by diamond machining. The tool had a square pattern of v-shaped grooves so that the sides of the grooves formed the faces of 4-sided pyramids having a spacing of 1 mm and an internal apex of 90°.

The nickel embossing die was placed with its patterned face up on a 13 mm×300 mm piece of aluminum. A 70 mm×300 mm×0.1 mm piece of PEEK (polyetherether ketone) film, manufactured by Westlake Plastics Co., Lenni, Pa.) was placed on top of the die. A piece of 38 mm×250 mm×0.5 mm FEP (fluoroethylene propylene copolymer) was placed on top of the PEEK and a second plate of 13 mm×80 mm×300 mm aluminum was placed on the FEP. This sandwich of aluminum plate, nickel die, PEEK, FEP, and aluminum plate was placed in a hot platen press (Model 3891 from Carver, Inc., Wabash, Ind.) with both platens set to 320° C., and 20,900 Kg of total force applied for 2 minutes. The actual pressure which was applied to the PEEK directly underneath the FEP was 21 MPa. The sandwich was removed from the hot presses and cooled, and the embossed PEEK was trimmed to a dimension of 38 mm×250 mm. The embossed PEEK was then placed on a hot plate set to 150° C. with the pattern of recesses (the surface which faced away from the tool) facing upwards. The hot plate (Thermodyne type 2200) had a heated surface measuring 300 mm×600 mm and was tilted very slightly by placing a 10 mm spacer under one end so as to give a slope of 1:60 (about 1°) The strip of PEEK was placed parallel to the long axis of the hot plate.

Figure 12:
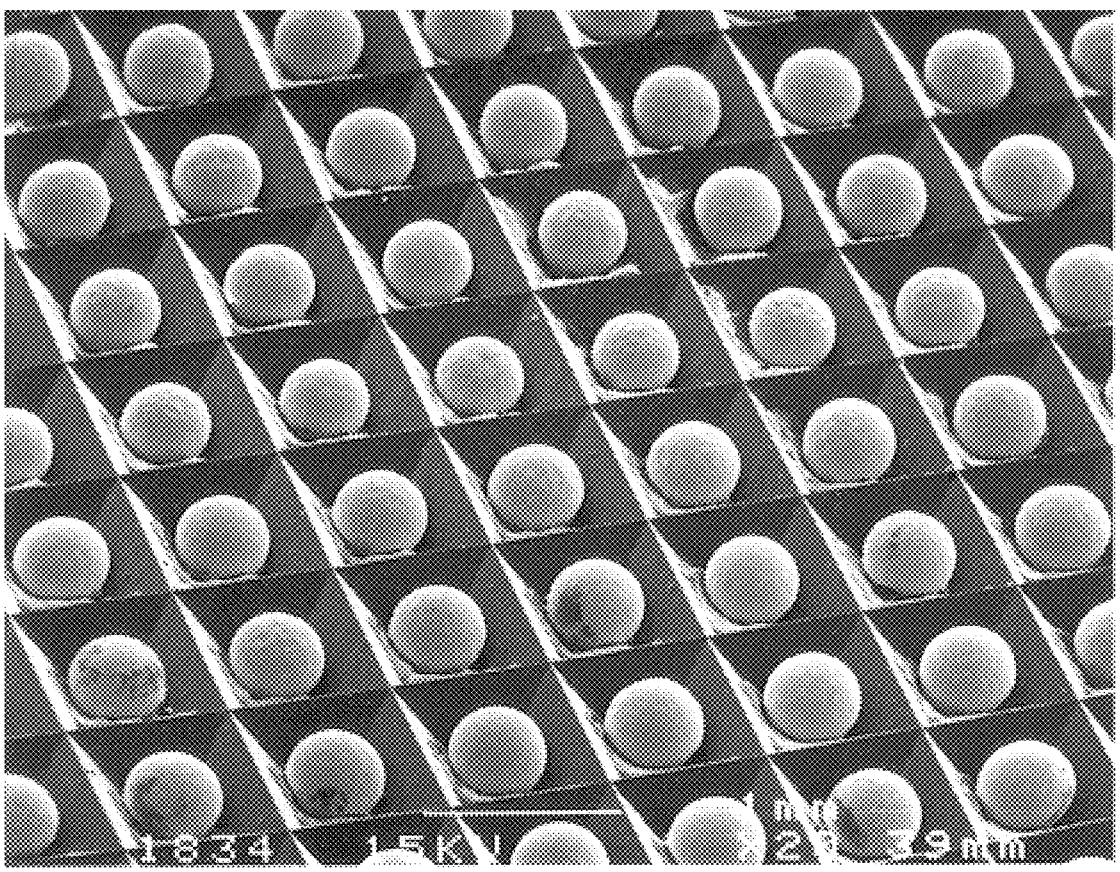
Figure 13:
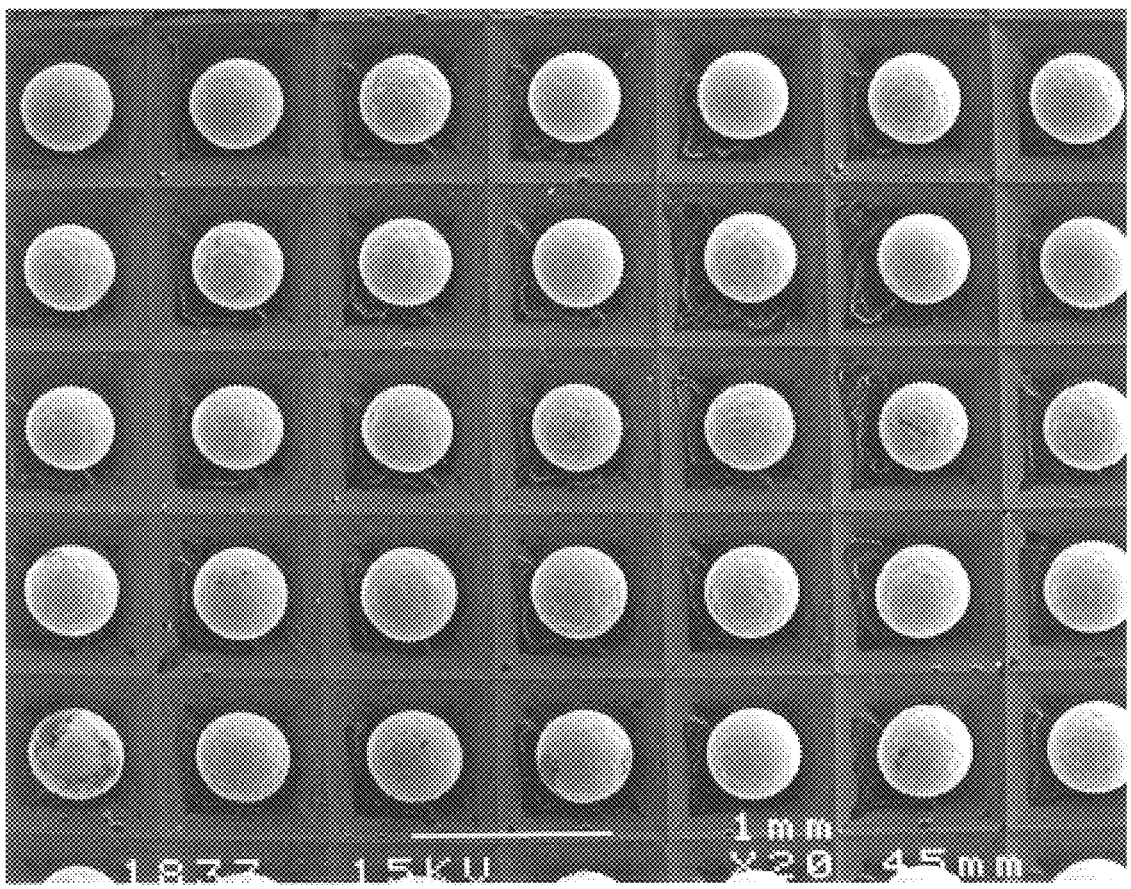

A 63/37 tin/lead solder foil of dimensions 0.064 mm×38 mm×230 mm, was placed on top of the PEEK. The solder foil was first smeared evenly on both sides with a flux available from Litton under the trade designation Kester SP593 flux at the rate of 0.0025 grams per square centimeter of solder foil. A piece of 70 mm×400 mm×0.5 mm polyimide (available from Dupont Co., Wilmington, Del. under the trade designation 200VN Kapton) was placed over the solder foil. A cylindrical piece of brass 95 mm in diameter and 38 mm width, weighing 2.25 Kg, was preheated to 250° C. and placed onto the polyimide at the downward sloping edge. This brass cylinder was then rolled over the top of the embossed PEEK at the rate of 30 mm/second. In this process, the solder foil underneath was melted. The molten solder formed an array of uniform balls 0.5 mm in diameter in the recesses of the embossed PEEK, as shown in the micrographs of FIGS. 12 and 13. FIG. 12 shows a field of view tilted 45° from the plane of the sample. FIG. 13 is viewed perpendicular to the plane of the sample. The polyimide was pulled off the PEEK as the roller passed over the polyimide, with care taken so as to not slide the polyimide relative to the PEEK which would cause the molten solder sections (balls) to smear.

EXAMPLE 3

Figure 14:
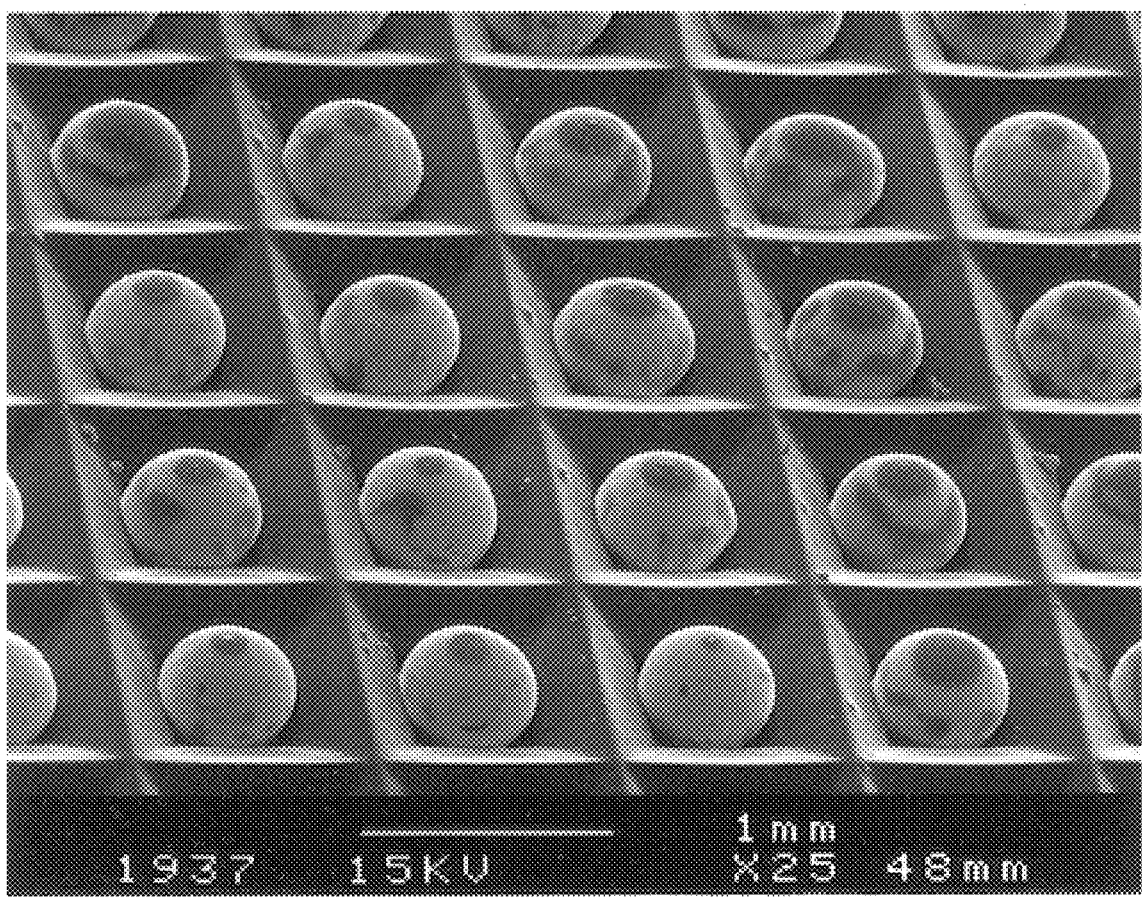

A nickel die (tool) similar to that of example 1, except with 1 mm spacing between the ridges and 90° internal apex angle, was electroformed from diamond machined acrylic plastic. The die measured 50 mm×300 mm×2 mm. It was placed on a 13 mm×80 mm×300 mm piece of aluminum with the textured side of the nickel die facing up. A piece of 0.1 mm×70 mm×300 mm PEEK film was placed over the tool. A piece of 0.064 mm×39 mm×230 mm solder foil was coated with 0.0025 g/cm$^2$ of Kester SP593 solder flux and placed over the PEEK. A piece of 0.5 mm×38 mm×250 mm FEP (fluoroethylene-propylene copolymer) was placed over the solder foil. A second piece of 13 mm×80 mm×300 mm aluminum was placed over the FEP. This sandwich of aluminum plate, nickel tool, PEEK, solder foil, FEP, and aluminum plate was placed into the Carver platen press, described in Example 2 above, and heated to 230° C. under a pressure of 21 MPa for 3 minutes. It was removed from the press and the top aluminum plate and the FEP were carefully removed from the sandwich exposing an array of uniform molten solder beads contained in pyramidal recesses in the PEEK, as shown in the micrograph of FIG. 14. The dark areas on the balls are small amounts of flux.

EXAMPLE 4

Figure 15:
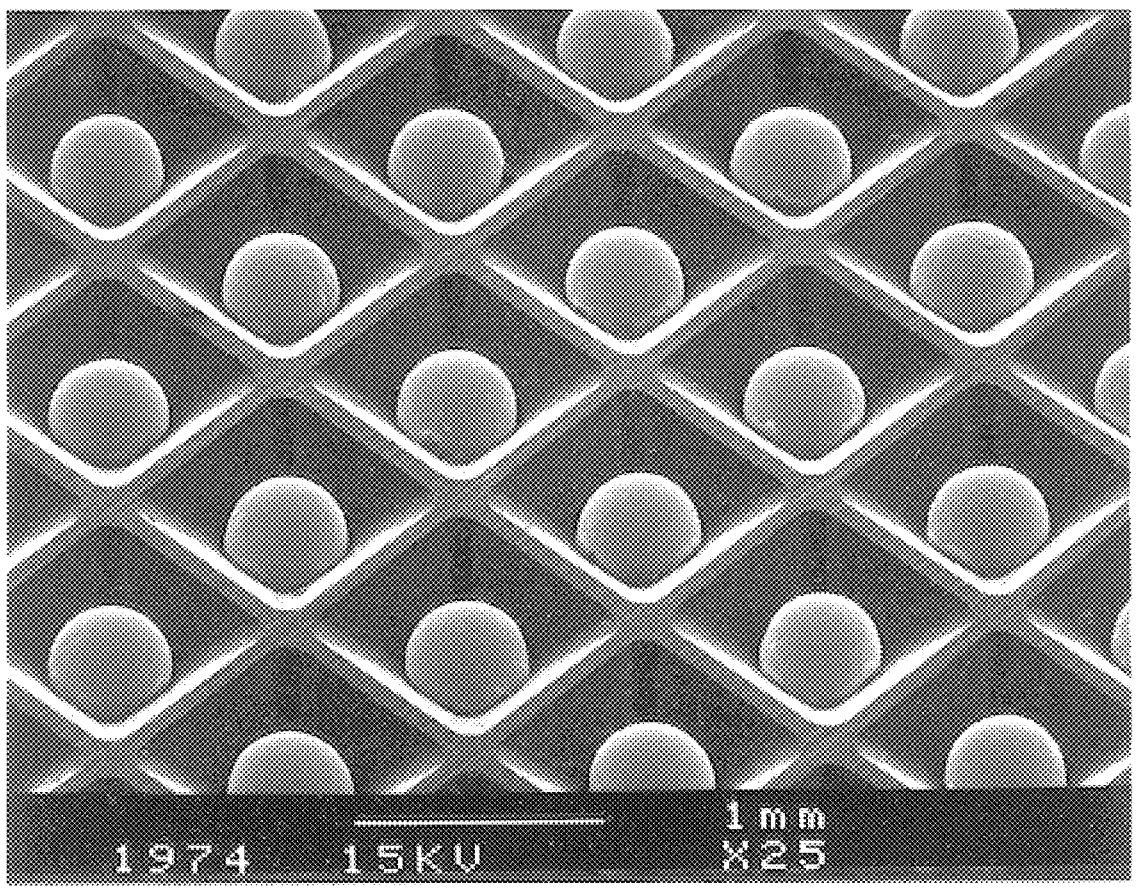

The 50 mm×300 mm×2 mm nickel embossing tool of Example 3 was placed with its patterned face down and against a 50 mm×300 mm×0.076 mm piece of 63/37 tin/lead solder foil. A 1.4 mm thickness of silicone rubber (available from Dow Corning under the trade designation RTV Silastic J) was placed on the other side of the solder foil to act as an elastic cushion layer. The tool, solder foil, and cushion layer were placed in the platen press described in Example 3 and 22,700 Kg of force was applied to this assembly. The resulting pressure was 15 MPa over the area of the solder foil. In this way the solder foil was embossed to have a pattern of 4 sided pyramids corresponding to the inverse of the pattern of the nickel embossing tool. The side of the embossed solder foil with the pyramidal projections was then coated with a liquid epoxy (available under the trade designation Epo-Quick from Buehler, Inc.) at the rate of 0.01 g epoxy per cm$^2$ of solder foil. The epoxy was cured for 1 hour at 85° C. The sample was then turned over to expose a pattern of square ridges of solder in the solder surface which was away from the nickel tool during embossing. A 50 mm×50 mm piece of #280 SiC abrasive paper was then used to wet sand the ridges until the epoxy was just exposed underneath. About 0.07 mm of thickness was removed. In the process of sanding the ridges, the solder foil was partitioned into discrete sections each bonded into a recess formed in the hardened epoxy. A water soluble solder flux (Kester type #2163) was sprayed onto the solder at the rate of 0.015 g/cm². The sample was then heated to 210° C. for 5 seconds, causing the solder to melt and form a uniform array of uniform size balls in the recesses of the epoxy backing, as shown in FIG. 15. FIG. 15 shows a field of view tilted 45° to the plane of the sample. The balls were all 0.48 mm in diameter.

EXAMPLE 5

A 38 mm×100 mm×0.18 mm piece of aluminum sheet was masked on one side with masking tape and coated on the other side by dip coating the aluminum sheet in a latex adhesive (available under the trade designation Aroset 2551-W-52 from Ashland Chemical, Inc.). The coating was air dried over 15 minutes. A piece of 38 mm×100 mm×0.076 mm 63/37 tin/lead solder was laminated to the adhesive side of the aluminum sheet. The masking tape was removed and the 50 mm×300 mm×2 mm nickel embossing tool used in examples 3 and 4 was placed with its patterned face down and against the non adhesive-coated side of the aluminum sheet. The embossing tool, solder foil, and adhesive-coated aluminum sheet were then compressed with a pressure of 80 MPa in a platen press. This pressure was sufficient to completely sever the solder foil into individual sections but not the underlying aluminum sheet. The aluminum sheet was removed from the platen press along with the attached section of solder foil. The side with the attached solder sections was then coated the same liquid epoxy used in Example 4, at the rate of 0.01 g of epoxy per cm². The epoxy was cured for 1 hour at 65° C. The aluminum sheet and latex adhesive were then peeled away from the solder sections, which remained adhered to the cured epoxy. The solder sections were then melted and spheroidized in a manner similar to that used in example 4. The resulting epoxy carrier tape had a solder ball size of 0.52 mm diameter and a pitch of 1 mm.

EXAMPLE 6

An embossing tool similar to that of Example 3, but with a pattern having a pitch of 0.35 mm, was used to emboss a 0.023 mm×38 mm×100 mm piece of 63/37 tin/lead solder. The embossing conditions were similar to those used in Example 4. The embossed solder foil was coated with epoxy and the epoxy cured in a manner similar to the method of Example 4. The solder was partitioned into sections contained in recesses in the cured epoxy by wet sanding the ridges of the pattern with #600 SiC abrasive paper. About 0.027 mm of the solder thickness was removed from the ridges. Flux was applied and the solder sections were melted in a manner similar to that of Example 4. The result was an 38 mm by 100 mm epoxy tape with a square array of 0.14 mm diameter solder balls having a pitch of 0.35 mm positioned within the recesses of the epoxy tape.

EXAMPLE 7

A 38 mm×200 mm×0.07 mm piece of solder foil, similar to that of Example 1 was embossed by placing the foil against the textured surface of the female patterned tool used in Example 3. A piece of silicone rubber (Silastic J RTV) of 1 mm thickness was placed on the other side of the solder foil. The silicone rubber/solder foil/embossing tool assembly was compressed in the platen press described in Example 2 to a pressure of 20 MPa and then separated. This pressure is not quite sufficient to partition the metal foil into sections. A 38 mm×200 mm piece of adhesive coated aluminum tape (available from 3M Company under the trade designation Type 417) similar to that of Example 1 was placed against the same female patterned tool with the aluminum side against the patterned side of the tool. A 38 mm×200 mm×1 mm sheet of silicone rubber was placed against the adhesive side of the aluminum tape. A pressure of 15 MPa was then applied to this assembly in the platen press. The assembly was removed from the press and the silicone rubber sheet was removed from the adhesive side of the aluminum tape. The side of the solder foil with the patterned projections was then placed against the adhesive side of the aluminum foil so that the projections of the solder foil fit into the recesses of the aluminum tape. The aluminum tape side of the assembly was placed once again against the embossing tool with the projections of the embossed pattern of the aluminum fitting into the recesses of the tool. The assembly was pressed together with a pressure of 5 MPa. The assembly was removed from the press and the patterned ridges of the solder foil were abraded in a manner similar to Example 4. A solder flux (Indalloy TacFlux 007) was applied to the solder side of the assembly at the rate of 0.003 g/cm². The aluminum tape side of the assembly was placed against a hot plate set at 250° C. to melt the solder. The resulting sample was an aluminum tape with a square pattern of pyramidal recesses measuring approximately 1 mm wide by 0.4 mm deep, each containing a solder ball of 0.4 mm diameter and with an acrylic/styrene butadiene rubber (SBR) adhesive to help contain the balls within their recesses.

EXAMPLE 8

Figure 16:
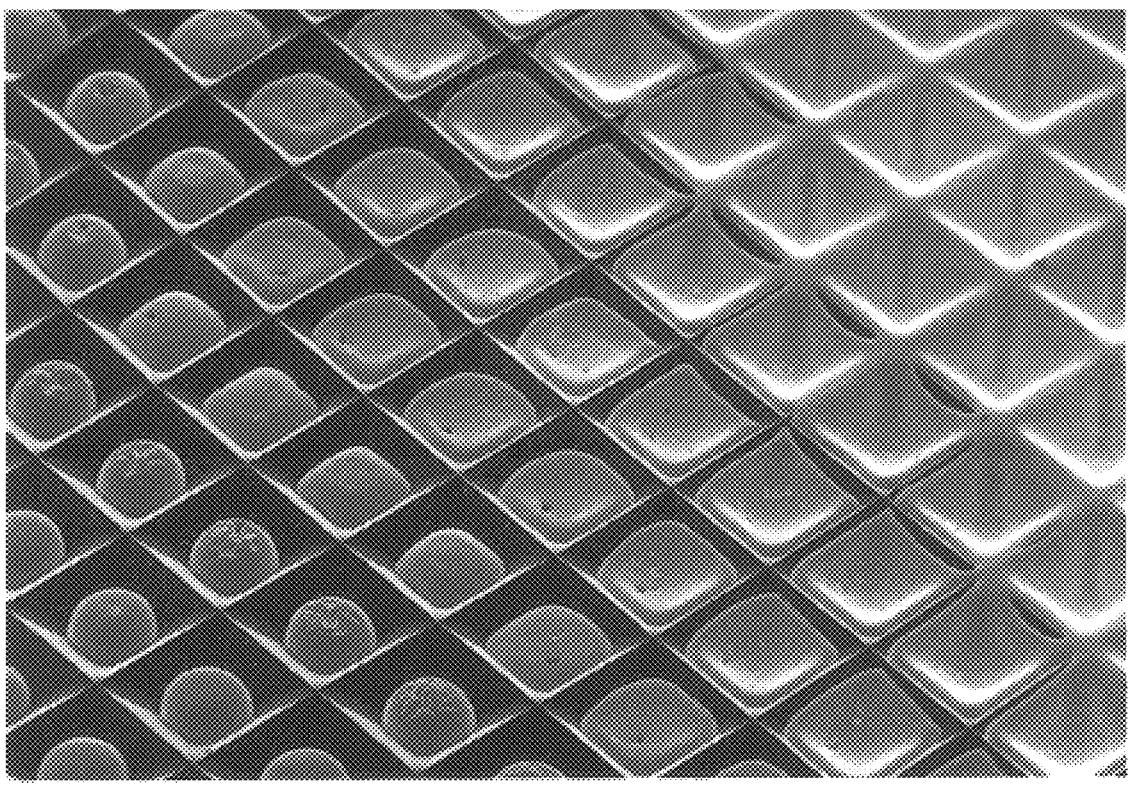

A 38 mm×300 mm×0.076 mm piece of 63/37 tin/lead solder foil was embossed in a manner identical to the method of Example 4. The embossed foil was coated on the side of the foil with the pyramidal projections with epoxy available from 3M Company under the trade designation Type 2216 at the rate of 0.01 g epoxy per cm² of solder foil. The epoxy coating was cured for 30 minutes at 100° C. Solder flux (Kester SP 596) was coated on the solder side of the sample at the rate of 0.03 g per cm² of the solder foil. The sample was laid onto a granite laboratory bench top with the solder side face up. The solder side of the sample was then heated with a propane torch held about 5 cm from the sample. The solder melted, partitioned into sections, and spheroidized to form an array of 0.5 mm diameter solder balls with a pitch of 1 mm, positioned in the recesses of the cured epoxy carrier substrate. The experiment was repeated in an identical manner except that the substrate was taped to a stainless steel plate and oriented so that the solder foil side of the sample was facing down during the melting step. In a separate experiment the solder foil was oriented vertically during the melting step. In both cases the resulting solder ball array was identical to the array created when the sample was oriented horizontally with the solder side face up. This experiment demonstrated that it is primarily surface tension rather than gravity which causes the molten solder to form into the recesses of the carrier substrate. FIG. 16 illustrates a section of the sample near the edge of a region where the flame was applied to the metal layer. The amount of heat applied was such that the metal layer in the upper right corner of the micrograph was unmelted while the metal in the lower left was completely melted. In between these two regions the metal at the ridges of the substrate is in various stages of partitioning and drawing into the recesses of the substrate to form balls. FIG. 17 shows a field of view 20° from horizontal showing the uniformity of the resulting balls in a part of the sample where the metal foil was completely melted. Before the micrographs of both FIGS. 16 and 17 were taken excess solder flux was washed from the sample using water.

EXAMPLE 9

A 50 mm×350 mm×0.025 mm piece of aluminum foil (available under the trade designation Reynolds Wrap from Reynolds Aluminum) was placed against the female patterned tool described in Example 3. A 38 mm×300 mm×0.076 mm piece of 63/37 tin/lead solder foil was placed on the top of the aluminum foil. A 1 mm thick piece of silicone rubber described in Example 7 was placed on top of the solder foil. The assembly was compressed for 5 seconds using a pressure of 23 MPa. Upon release of pressure the solder foil and aluminum foil stayed adhered together. Solder flux (Kester SP 596) was applied to the solder foil side of the sample at the rate of 0.03 g/cm$^2$ and the sample was heated using a propane torch in a manner similar to that of Example 8. The solder melted, partitioned, and spheroidized to form an array of 0.5 mm diameter balls with a pitch of 1 mm contained in the recesses of the aluminum foil carrier substrate.

Throughout the specification and claims of the present application, it will be appreciated that like words have like definitions. It will also be appreciated that any number of the grid patterns or recess shapes can be used in accordance with the principles of the present invention. Furthermore, with regard to the foregoing description, it is to be understood that changes may be made in detail, especially in matters of the construction materials employed and the shape, size, and arrangement of the parts without departing from the scope of the present invention. It is intended that the specification and depicted embodiments be considered exemplary only, with a true scope and spirit of the invention being indicated by the broad meaning of the following claims.

What is claimed is:

1. A method for making an array of metal balls comprising the steps of:

generating a first pattern on a continuous sheet of metal foil, the first pattern including a plurality of metal foil projections on the continuous sheet of metal foil;

generating a second pattern on a carrier substrate, the second pattern including a plurality of carrier recesses arranged and configured to correspond with the foil projections of the first pattern;

placing the continuous sheet of metal foil and the carrier substrate together such that the foil projections of the metal foil fit within the carrier recesses of the carrier substrate such that the opposing surfaces of the metal foil and carrier substrate are in intimate contact with one another prior to melting the metal foil; and melting the metal foil such that the foil projections form metal balls positioned within the carrier recesses of the carrier substrate.

2. The method of claim 1, further comprising the step of coating the metal foil with a fluxing agent after the metal foil and the carrier substrate are placed together.

3. The method of claim 1, wherein the opposing surfaces are bonded together by means of an adhesive prior to melting the metal foil.

4. The method of claim 1, wherein the exposed side of the metal foil includes a plurality of ridges, and the ridges comprise portions of the metal foil that are removed or displaced to partition the projections into discrete sections prior to complete melting of the metal foil to form balls.

5. The method of claim 4, wherein the portions of metal foil are displaced by compressing the metal ridges with a die.

6. The method of claim 4, wherein the portions of metal foil are removed via abrasion.

7. The method of claim 4, wherein the portions of the metal are displaced via melting.

8. The method of claim 7, wherein the melting occurs in a temperature gradient applied so that the metal at the ridges of the exposed side of the foil are the hottest and the metal in the recesses against the carrier substrate are the coolest.

9. A method for making an array of metal balls comprising the steps of:

generating a first pattern on a metal foil, the first pattern including a plurality of metal foil projections;

generating a second pattern on a carrier substrate, the second pattern including a plurality of carrier recesses arranged and configured to correspond with the foil projections of the first pattern;

placing the metal foil and the carrier substrate together such that the foil projections of the metal foil fit within the carrier recesses of the carrier substrate; and melting the metal foil such that the foil projections form metal balls positioned within the carrier recesses of the carrier substrate, wherein the first and second patterns are generated by concurrently embossing both the carrier substrate and the metal foil with an embossing tool.

10. The method of claim 1, wherein the first pattern is generated on the metal foil by:

pre-generating the second pattern on the carrier substrate; and depositing a metal foil on the patterned surface of the carrier substrate.

11. The method of claim 1, wherein the second pattern is generated on the carrier substrate by:

pre-generating the first pattern on the metal foil;

placing a flowable backing material over the patterned metal foil such that the foil projections of the first pattern are substantially covered by the backing material; and hardening the backing material on the metal foil such that the hardened backing material forms the carrier substrate, wherein first pattern on the metal foil generates the second pattern on the carrier substrate.

12. The method of claim 1, wherein the metal foil comprises solder.

13. The method of claim 1, wherein the carrier substrate comprises a carrier tape.

* * * * *